(12) United States Patent
Cohen

(10) Patent No.: US 12,229,479 B1
(45) Date of Patent: *Feb. 18, 2025

(54) COGNOLOGY AND COGNOMETRICS SYSTEM AND METHOD

(71) Applicant: MANAGEMENT ANALYTICS, INC., Pebble Beach, CA (US)

(72) Inventor: Fred Cohen, Pebble Beach, CA (US)

(73) Assignee: MANAGEMENT ANALYTICS, INC., Pebble Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/820,162

(22) Filed: Aug. 29, 2024

Related U.S. Application Data

(63) Continuation of application No. 18/232,522, filed on Aug. 10, 2023.

(60) Provisional application No. 63/464,487, filed on May 5, 2023.

(51) Int. Cl.
*G06F 30/20* (2020.01)

(52) U.S. Cl.
CPC .................................. *G06F 30/20* (2020.01)

(58) Field of Classification Search
CPC ....................................................... G06F 30/20
USPC ............................................................ 703/11
See application file for complete search history.

(56) References Cited

U.S. PATENT DOCUMENTS

| | | |
|---|---|---|
| 4,803,642 A | 2/1989 | Muranaga |
| 5,032,979 A | 7/1991 | Hecht |
| 5,414,833 A | 5/1995 | Ramacher |
| 5,488,715 A | 1/1996 | Wainwright |
| 5,557,742 A | 9/1996 | Smaha |
| 5,606,668 A | 2/1997 | Shwed |
| 5,621,889 A | 4/1997 | Lermuzeaux |
| 5,848,261 A | 2/1998 | Farry |
| 5,732,200 A | 3/1998 | Becker |
| 5,795,942 A | 8/1998 | Esbensen |
| 5,812,128 A | 9/1998 | Sterling |
| 5,926,794 A | 7/1999 | Fethe |
| 5,966,650 A | 10/1999 | Hobson |
| 6,070,244 A | 5/2000 | Orchier |
| 6,088,804 A | 7/2000 | Hill |
| 6,145,084 A | 11/2000 | Zuili |
| 6,188,403 B1 | 2/2001 | Sacerdoti |
| 6,222,540 B1 | 4/2001 | Sacerdoti |
| 6,298,445 B1 | 10/2001 | Shostack |
| 6,351,680 B1 | 2/2002 | Ali |
| 6,507,766 B2 | 1/2003 | Khan |
| 6,535,775 B1 | 3/2003 | Bagepalli |
| 6,647,400 B1 | 11/2003 | Moran |
| 6,671,281 B1 | 12/2003 | Tsuda |

(Continued)

FOREIGN PATENT DOCUMENTS

| | | |
|---|---|---|
| CN | 102413011 B | 9/2015 |
| WO | 2014055395 A2 | 4/2014 |
| WO | 2014150507 A2 | 9/2014 |

OTHER PUBLICATIONS

Scarfone et al., "Technical Guide to Information Security Testing and Assessment" by NIST, pp. 80, Sep. 2008.

(Continued)

*Primary Examiner* — Andre Pierre Louis
(74) *Attorney, Agent, or Firm* — Manatt, Phelps & Phillips, LLP

(57) ABSTRACT

A system and method for cognology and cognometrics.

31 Claims, 24 Drawing Sheets

(56) References Cited

U.S. PATENT DOCUMENTS

| | | |
|---|---|---|
| 6,738,916 B1 | 5/2004 | Gladden |
| 6,771,293 B1 | 8/2004 | Josephson |
| 6,980,927 B2 | 12/2005 | Tracy |
| 7,062,458 B2 | 6/2006 | Maggioncalda |
| 7,072,825 B2 | 7/2006 | Wang |
| 7,321,883 B1 | 1/2008 | Freedy |
| 7,496,533 B1 | 2/2009 | Keith |
| 7,516,227 B2 | 4/2009 | Cohen |
| 7,593,743 B2 | 9/2009 | Alasaarela |
| 7,657,942 B2 | 2/2010 | Himberger |
| 7,660,705 B1 | 2/2010 | Meek |
| 8,041,647 B2 | 10/2011 | Claier |
| 8,095,492 B2 | 1/2012 | Cohen |
| 8,484,149 B1 | 7/2013 | Kelly |
| 8,955,058 B2 | 2/2015 | Castro |
| 9,092,631 B2 | 7/2015 | Muller |
| 9,100,430 B1 | 8/2015 | Seiver |
| 9,292,695 B1 | 3/2016 | Basseli |
| 9,330,262 B2 | 5/2016 | Salehie |
| 9,432,335 B1 | 8/2016 | Stevenson |
| 9,462,020 B2 | 10/2016 | Stevenson |
| 9,800,604 B2 | 10/2017 | Knapp |
| 11,023,901 B2 | 6/2021 | Cohen |
| 2001/0027455 A1 | 10/2001 | Abulleil |
| 2002/0013720 A1 | 1/2002 | Ozono |
| 2002/0038321 A1 | 3/2002 | Keeley |
| 2002/0042731 A1 | 4/2002 | King |
| 2002/0111835 A1 | 8/2002 | Hele |
| 2002/0169658 A1 | 11/2002 | Adler |
| 2003/0033191 A1 | 2/2003 | Davies |
| 2003/0088381 A1 | 5/2003 | Henry |
| 2003/0120577 A1 | 6/2003 | Sakui |
| 2003/0149571 A1 | 8/2003 | Francesco |
| 2003/0208429 A1 | 11/2003 | Benneli |
| 2003/0229509 A1 | 12/2003 | Hall |
| 2004/0030592 A1 | 2/2004 | Buck |
| 2004/0085316 A1 | 5/2004 | Malik |
| 2004/0102923 A1 | 5/2004 | Tracy |
| 2004/0102940 A1 | 5/2004 | Lendermann |
| 2004/0162752 A1 | 8/2004 | Dean |
| 2004/0210574 A1 | 10/2004 | Aponte |
| 2004/0236655 A1 | 11/2004 | Scumniotales |
| 2005/0004789 A1 | 1/2005 | Summers |
| 2005/0043922 A1 | 2/2005 | Weidi |
| 2005/0049987 A1 | 3/2005 | Meek |
| 2005/0060213 A1 | 3/2005 | Lavu |
| 2005/0091077 A1 | 4/2005 | Reynolds |
| 2005/0209866 A1 | 9/2005 | Veeningen |
| 2006/0047561 A1 | 3/2006 | Bolton |
| 2006/0085434 A1 | 4/2006 | Mah |
| 2006/0106570 A1 | 5/2006 | Feldman |
| 2006/0121436 A1 | 6/2006 | Kruse |
| 2006/0129439 A1 | 6/2006 | Arlt |
| 2007/0115993 A1 | 5/2007 | Cohen |
| 2007/0156814 A1 | 7/2007 | Cohen |
| 2007/0186283 A1 | 8/2007 | Brumbaugh |
| 2007/0194097 A1 | 8/2007 | Jones |
| 2007/0239696 A1 | 10/2007 | Xu |
| 2008/0005677 A1 | 1/2008 | Thompson |
| 2008/0015889 A1 | 1/2008 | Fenster |
| 2008/0036767 A1 | 2/2008 | Janzen |
| 2008/0047018 A1 | 2/2008 | Baudoin |
| 2008/0140688 A1 | 6/2008 | Clayton |
| 2008/0162216 A1 | 7/2008 | Clayton |
| 2008/0192056 A1 | 8/2008 | Robertson |
| 2009/0006156 A1 | 1/2009 | Hunt |
| 2009/0113312 A1 | 4/2009 | Schoenberg |
| 2009/0126022 A1 | 5/2009 | Sakaki |
| 2009/0265787 A9 | 10/2009 | Baudoin |
| 2009/0307159 A1 | 12/2009 | Pinckney |
| 2010/0057645 A1 | 3/2010 | Lauritsen |
| 2010/0114634 A1 | 5/2010 | Christiansen |
| 2010/0145715 A1 | 6/2010 | Cohen |
| 2010/0153156 A1 | 6/2010 | Guinta |
| 2010/0174585 A1 | 7/2010 | Kellogg |
| 2010/0179843 A1 | 7/2010 | Johnson |
| 2010/0274753 A1 | 10/2010 | Liberty |
| 2010/0305993 A1 | 12/2010 | Fisher |
| 2010/0312724 A1 | 12/2010 | Pinckney |
| 2011/0047087 A1 | 2/2011 | Young |
| 2011/0126111 A1 | 5/2011 | Gill |
| 2011/0189645 A1 | 8/2011 | Leininger |
| 2011/0238566 A1 | 9/2011 | Santos |
| 2011/0307806 A1 | 12/2011 | Hills |
| 2012/0084867 A1 | 4/2012 | Baggett |
| 2012/0180133 A1 | 7/2012 | Al-Harbi |
| 2012/0185479 A1 | 7/2012 | Forver |
| 2012/0310961 A1 | 12/2012 | Callison |
| 2013/0031037 A1 | 1/2013 | Brandt |
| 2013/0042007 A1 | 2/2013 | Linton |
| 2013/0097706 A1 | 4/2013 | Titonis |
| 2013/0097709 A1 | 4/2013 | Basavapatna |
| 2013/0179215 A1 | 7/2013 | Foster |
| 2013/0211927 A1* | 8/2013 | Kellogg ............. G06Q 30/0631 705/14.73 |
| 2013/0275176 A1 | 10/2013 | Brown |
| 2013/0311224 A1 | 11/2013 | Heroux |
| 2014/0222694 A1 | 8/2014 | Chen |
| 2014/0278566 A1 | 9/2014 | McLaughlin |
| 2016/0044057 A1 | 2/2016 | Chenette |
| 2016/0078551 A1 | 3/2016 | Samuels |
| 2016/0092884 A1 | 3/2016 | Weaver |
| 2016/0125296 A1 | 5/2016 | Filipuzzi |
| 2016/0246991 A1 | 8/2016 | Bell |
| 2019/0182289 A1 | 6/2019 | White |
| 2019/0261908 A1 | 8/2019 | Allilama |
| 2022/0375622 A1* | 11/2022 | Gnanasambandam ..................... G16H 15/00 |

OTHER PUBLICATIONS

Cohen, "A Note on the Role of Deception in Information Protection", c. 1998, All.Net, 13 pages.

Cohen et al., "A Framework for Deception", Computers and Security, Year: 2001, All.Net, 67 pages.

Cohen, "The Use of Deception Techniques: Honeypots and Decoys", Year: 2004, All.Net, 24 pages.

Cohen, "A Mathematical Structure of Simple Defensive Networks Deceptions", Fred Cohen & Associates, c, 1999, All.Net, 12 pages.

Cohen et al., "Red Teaming Experiments with Deception Technologies", Year: 2001, All.Net, 25 pages.

Yarkoni, "Personality in 100,000 Words: A large-scale analysis of personality and word use among bloggers", National Institute of Health, NIH Public Access, J Res Pers, Jun. 1, 2010; 44(3): 363-373. doi:10.1016/j.jrp.2010.04.001, 23 pages.

Pennebaker et al., "Linguistic Inquiry and Word Count: LIWC2015—Operator's Manual", 2015, Austin, TX: Pennebaker Conglomerates (www.UWC.net), 23 pages.

Yankelovich et al., "Rediscovering Market Segmentation", Harvard Business Review, Feb. 2006, https://www.hbr.org/, 12 pages.

Beatty et al., "Problems with VALS International Marketing Research: An Example from an Application of the Empirical Mirror Technique", Advances in Consumer Research, vol. 15, Issue 1, Provo, UT: Association for Consumer Research, 1988, pp. 375-380.

Maslow, "A Theory of Human Motivation", Year: 1943, Brooklyn College, pp. 370-396.

Cronje, "Paradigms Regained: Toward Integrating Objectivism and Constructivism in Instructional Design and the Learning Sciences", Year: 2006, ETR&D, vol. 54, No. 4, pp. 387-416.

Grandori, "A Prescriptive Contingency View of Organizational Decision Making", Year: Jun. 1984, Sage Publications, Inc., Cornell University, Administrative Science Quarterly, vol. 29, No. 2, pp. 192-209.

Furuncu et al., "Scalable risk assessment method for cloud computing using game theory (CCRAM)", Computer Standards and Interfaces, Year: 2014, Elsevier.corn, 7 pages.

Lee et al., "Scalable Attack Graph for Risk Assessment", Feb. 2009, Division of Computer and Communication Engineering, Korea University, Seoul Korea, 6 pages.

(56) References Cited

OTHER PUBLICATIONS

Smart, "Developing a decision-making framework for implementing purchasing synergy: a case study", International Journal of Physical Distribution & Logistics Management, vol. 37, No. 1, 2004, pp. 64-89.
Winston, "Artificial Intelligence", Massachusetts Institute of Technology, Addison-Wesley, 1992, Chapter 7, Mycin Diagnoses pp. 130-132.
Cohen, "Frauds, Spies, and Lies", ASP Press, 2005, 234 pages.
Cohen, "Computer Viruses", (Year: 1985), 117 pages.

\* cited by examiner

The Psych-Analyzer

Welcome to Psycho. Enter text to be analyzed here and press "Go".

Sample data from the CEO goes here...

(1) Information is gathering in voice form from recordings of CEOs presenting their companies to investors. For example, Angel to Exit does this as part of it's Go To Angel service. From there, voice to text is used, for example from Google services or other vendors, to turn the information gathered into text content for analysis. The content is packaged as the CEO contact and other information gathered from independent 3rd parties along with the text output.

FIGURE 4

Analysis of the provided text
Background

The following analysis of the Big 5 and subcomponents is based on *Personality in 100,000 Words: A large-scale analysis of personality and word use among bloggers* by Tal Yarkoni University of Colorado at Boulder, and using the Linguistic Inquiry and Word Count, or LIWC (Pennebaker, Francis, & Booth, 2001) dictionary of *The Psychological Functions of Function Words* by Cindy Chung and James Pennebaker.

The analysis is best when provided with a sample of normal expressive writing in the range of 2,000 words or more. 20,000 words would be much better, and of course, results may vary. The method is based on substantive psychological studies involving subjects given the Big 5 test in different levels of depth and sufficient samples to provide 95% certainty or better with respect to results, with results correlated to LIWC categories against those participants' historical blogs containing 20,000 words or more of total volume. The correlates are then applied by searching the input for words against LIWC dictionary entries, counting the number words in each category, dividing them into the total number of words for normalization, multiplying by the correlates from the study for each subcategory, and then using independent correlates to compute a score for each Big 5 category. [Square brackets contains the average of the subfactors.]

Interpretation

Results should range between -1 and 1, with -1 representing maximum negative correlation (i.e., the component part is contraindicated to the maximum extent possible) and 1 representing maximum positive correlation (i.e., the component part is indicated to the maximum extent possible). For small input sizes (<< 2,000 words) results are typically not statistically significant. At 2,000 words, statistics are reasonably valid, and at 20,000 words, they should be far better. Precision (number of digits) in output reflect the size of the input. In this case. The input has 142 words from the LIWC dictionary, so that will be the basis of rates used input, in this case. The input is 142 words long, so you will get 1 digits of precision.

| Range | [-0.50] | [-0.40] | [-0.30] | [-0.20] | [-0.10] | [0.00] | [0.10] | [0.20] | [0.30] | [0.40] | [0.50] |
|---|---|---|---|---|---|---|---|---|---|---|---|
| Neuroticism | | | | | | 0.0 | | | | | |
| Extraversion | | | | | | 0.0 | | | | | |
| Openness | | | | | | 0.0 | | | | | |
| Agreeableness | | | | | | | 0.1 | | | | |
| Conscientiousness | | | | | | -0.0 | | | | | |

FIGURE 5A-1
TO FIGURE 5A-2

FROM FIG. 5A-1

Detailed results

LIWC rates in text

| Dictionary element | Count | Rating |
|---|---|---|
| 1stPerson | 0 | [0.0] |
| 1stPersonPlural | 0 | [0.0] |
| 1stPersonSingular | 0 | [0.0] |
| 2ndPerson | 0 | [0.0] |
| Achievement | 0 | [0.0] |
| Affect | 1 | [0.0] |
| Anger | 1 | [0.0] |
| Anxiety | 0 | [0.0] |
| Article | 0 | [0.0] |
| Assent | 0 | [0.0] |
| BodyStates | 0 | [0.0] |
| Causation | 2 | [0.0] |
| Certainty | 0 | [0.0] |
| CognitiveProcesses | 2 | [0.0] |
| Communication | 1 | [0.0] |
| Death | 1 | [0.0] |
| Discrepancy | 0 | [0.0] |

Results

Neuroticism = 0.0 [0.0]
- Anxiety=0.0
- Anger=0.0
- Depression=0.0
- SelfConsciousness=0.0
- Immoderation=0.0
- Vulnerability=0.0

[A tendency to easily experience unpleasant emotions such as anxiety, anger, or depression.]

Neuroticism refers to the tendency to experience negative feelings. Those who score high on Neuroticism may experience primarily one specific negative feeling such as anxiety, anger, or depression, but are likely to experience several of these emotions. People high in Neuroticism are emotionally reactive. They respond emotionally to events that would not affect most people, and their reactions tend to be more intense than normal. They are more likely to interpret ordinary situations as threatening, and minor frustrations as hopelessly difficult. Their negative emotional reactions tend to persist for unusually long periods of time, which means they are often in a bad mood. These problems in emotional regulation can diminish a neurotic's ability to think clearly, make decisions, and cope effectively with stress.

At the other end of the scale, individuals who score low in Neuroticism are less easily upset and are less emotionally reactive. They tend to be calm, emotionally stable, and free from persistent negative feelings. Freedom from negative feelings does not mean that low scorers experience a lot of positive feelings; frequency of positive emotions is a component of the Extroversion domain.

FIGURE 5A-2
TO FIGURE 5A-3

FROM FIG. 5A-2

| | | |
|---|---|---|
| Down | 0 | [0.0] |
| Eating | 0 | [0.0] |
| Exclusive | 5 | [0.0] |
| Family | 1 | [0.0] |
| Feeling | 0 | [0.0] |
| Friends | 0 | [0.0] |
| FutureTense/VB | 0 | [0.0] |
| Grooming | 0 | [0.0] |
| Hearing | 3 | [0.0] |
| Home | 0 | [0.0] |
| Humans | 0 | [0.0] |
| Inclusive | 6 | [0.1] |
| Inhibition | 0 | [0.0] |

Extraversion = 0.0 [0.0]
- Friendliness=0.0
- Gregariousness=0.0
- Assertiveness=0.0
- ActivityLevel=0.0
- ExcitementSeeking=0.0
- Cheerfulness=0.1

[Energy, surgency, and the tendency to seek stimulation and the company of others.]

Extraversion is marked by pronounced engagement with the external world. Extraverts enjoy being with people, are full of energy, and often experience positive emotions. They tend to be enthusiastic, action-oriented, individuals who are likely to say "Yes!" or "Let's go!" to opportunities for excitement. In groups they like to talk, assert themselves, and draw attention to themselves.

Introverts lack the exuberance, energy, and activity levels of extraverts. They tend to be quiet, low-key, deliberate, and disengaged from the social world. Their lack of social involvement should not be interpreted as shyness or depression; the introvert simply needs less stimulation than an extravert and prefers to be alone.

FIGURE 5A-3
TO FIGURE 5A-4

FROM FIG. 5A-3

| | | |
|---|---|---|
| Insight | 4 | [0.0] |
| Leisure | 3 | [0.0] |
| MetaphysicalStates | 2 | [0.0] |
| Money | 1 | [0.0] |
| Motion | 4 | [0.0] |
| Movies | 0 | [0.0] |
| Music | 3 | [0.0] |
| Negation | 0 | [0.0] |
| NegativeEmotion | 1 | [0.0] |
| Numbers | 0 | [0.0] |
| Occupation | 1 | [0.0] |
| Optimism | 0 | [0.0] |
| Other | 0 | [0.0] |
| OtherReferences | 0 | [0.0] |
| PastTenseVB | 1 | [0.1] |
| PhysicalStates | 0 | [0.0] |
| PositiveEmotion | 1 | [0.0] |
| PositiveFeelings | 0 | [0.0] |

Openness = 0.0 [0.0]
Imagination=0.0
ArtisticInterests=0.0
Emotionality=0.0
Adventurousness=0.0
Intellect=0.0
Liberalism=0.1

Appreciation for art, emotion, adventure, and unusual ideas; imaginative and curious.]*

Openness to Experience describes a dimension of cognitive style that distinguishes imaginative, creative people from down-to-earth, conventional people. Open people are intellectually curious, appreciative of art, and sensitive to beauty. They tend to be, compared to closed people, more aware of the feelings. They tend to think and act in individualistic and nonconforming ways. People with low scores on openness to experience tend to have narrow, common interests. They prefer the plain, straightforward, and obvious over the complex, ambiguous, and subtle. They may regard the arts and sciences with suspicion, regarding these endeavors as abstruse or of no practical use. Closed people prefer familiarity over novelty; they are conservative and resistant to change.

Openness is often presented as healthier or more mature by psychologists, who are often themselves open to experience. However, open and closed styles of thinking are useful in different environments. The intellectual style of the open person may serve a professor well, but research has shown that closed thinking is related to superior job performance in police work, sales, and a number of service occupations.

* This factor has predominantly negative correlations and is skewed away from measured openness in Big 5 tests.

FIGURE 5A-4
TO FIGURE 5A-5

FROM FIG. 5A-4

| | | |
|---|---|---|
| Prepositions | 24 | [0.2] |
| PresentTense/B | 0 | [0.1] |
| Religion | 2 | [0.0] |
| Sadness | 0 | [0.0] |
| School | 0 | [0.0] |
| Seeing | 2 | [0.0] |
| SensoryProcesses | 0 | [0.0] |
| Sexual | 0 | [0.0] |
| Sleeping | 0 | [0.0] |
| SocialProcesses | 14 | [0.1] |
| Space | 6 | [0.0] |
| Sports | 2 | [0.0] |
| Swearing | 0 | [0.0] |
| Tentative | 12 | [0.1] |
| Time | 2 | [0.0] |

Agreeableness = 0.1 [0.0]

Trust=0.0
Maturity=0.0
Altruism=0.0
Cooperation=0.0
Modesty=0.0
Sympathy=0.0

[A tendency to be compassionate and cooperative rather than suspicious and antagonistic towards others.]

Agreeableness reflects individual differences in concern with cooperation and social harmony. Agreeable individuals value getting along with others. They are therefore considerate, friendly, generous, helpful, and willing to compromise their interests with others. Agreeable people also have an optimistic view of human nature. They believe people are basically honest, decent, and trustworthy.

Disagreeable individuals place self-interest above getting along with others. They are generally unconcerned with others' well-being, and therefore are unlikely to extend themselves for other people. Sometimes their skepticism about others' motives causes them to be suspicious, unfriendly, and uncooperative.

Agreeableness is obviously advantageous for attaining and maintaining popularity. Agreeable people are better liked than disagreeable people. On the other hand, agreeableness is not useful in situations that require tough or absolute objective decisions. Disagreeable people can make excellent scientists, critics, or soldiers.

FIGURE 5A-5
TO FIGURE 5A-6

FROM FIG. 5A-5

| TotalPronouns | 11 | [0.1] |
|---|---|---|
| I/P | 3 | [0.0] |
| Work | 6 | [0.0] |

Conscientiousness = -0.0 [-0.0]
- SelfEfficiency=0.0
- Orderliness=0.0
- Dutifulness=0.0
- AchievementStriving=0.0
- SelfDiscipline=0.0
- Cautiousness=0.0

[A tendency to show self-discipline, act dutifully, and aim for achievement.]

Conscientiousness concerns the way in which we control, regulate, and direct our impulses. Impulses are not inherently bad; occasionally time constraints require a snap decision, and acting on our first impulse can be an effective response. Also, in times of play rather than work, acting spontaneously and impulsively can be fun. Impulsive individuals can be seen by others as colorful, fun-to-be-with, and zany. Conscientiousness includes the factor known as Need for Achievement (NAch).

The benefits of high conscientiousness are obvious. Conscientious individuals avoid trouble and achieve high levels of success through purposeful planning and persistence. They are also positively regarded by others as intelligent and reliable. On the negative side, they can be compulsive perfectionists and workaholics. Furthermore, extremely conscientious individuals might be regarded as stuffy and boring. Unconscientious people may be criticized for their unreliability, lack of ambition, and failure to stay within the lines, but they will experience many short-lived pleasures and they will never be called stuffy.

FIGURE 5A-6

| Characteristics: | | Strategies: | Advice: P=1000 C=200 M=5000 E=200 F=1000 D=200 =2800 |
|---|---|---|---|
| Top executive | ▷ | incite support | ▷ |
| Irritating | ▷ | flattery | |
| Well Heeled | ▷ | Support as sponsor | ▷ |
| Ignorant | ▷ | Cite experts to them | ▷ |
| Strong | ▷ | Ally with them | ▷ |
| Professional rival | ▷ | | |
| Late adopter | ▷ | | |

FIGURE 6

Short Report

Report for test - CEO

Relative Power Situation Quick Report:

on time normal timing
Support: opponent on time favors
Expectation: good - expect hesitant
Improvement approach: use this as an opportunity to befriend
Influence options: reason persuasion magnetism novelty
Threats:
Importance: 1387
Position: Keep informed to keep them friendly, reference support, and use this as an opportunity to befriend.
Charisma: Use your charisma to keep support and increase interest.
Money: Generate 'leadership' funding and create vested interest.
Expertise: Provide referential support of experts.
Force: Increase interest and keep engaged.

Current strategy:

| Area | Strategy | Effect | Persona | You |
|---|---|---|---|---|
| Position: | note support | 16000 | Top executive | Director |
| Charisma: | flattery | 1200 | Irritating | Soso |
| Money: | Support as sponsor | 6000 | Well Heeled | Enough |
| Expertise: | Cite experts to them | 1200 | Ignorant | Qualified |
| Force: | Ally with them | 1600 | Strong | Able |
| Nature: | Things Fall Apart | -200 | | |

FIGURE 7

Psych is (c) Fred Cohen, 2023 - All Rights Reserved

Summary

| Customer characteristics | Benefits and Differentiators | Memes | Expressions |
|---|---|---|---|
| OB5N3L: Depression | | B5N3L: Be happy | EJ2: A pleasure to work with |
| OB5E4L: Activity Level | BD06B: Excellent service | B5E4L: Let's do it together | EJ2: A pleasure to work with |
| OB5O4L: Adventurousness | BD07C: Ahead of the curve | B5O4L: A new experience | ER1: A unique experience |
| OB5A4L: Cooperation | BD13: Trustworthy<br>BD14A: Most Reliable<br>BD06B: Excellent service | B5A4L: Together we stand | EJ2: A pleasure to work with |

FIGURE 8A
TO FIGURE 8B

From FIG. 8A

Benefits and Differentiators
- Good Price
- Top Quality
- Convenience
- Excellent service
- Brand you can count on
- Ahead of the curve
- On time
- Accuracy
- Exacting
- Trustworthy
- Most Reliable

Memes
- Be happy
- Let's do it together
- A new experience
- Together we stand

Expressions
- Nobody does it better
- A unique experience
- A pleasure to work with

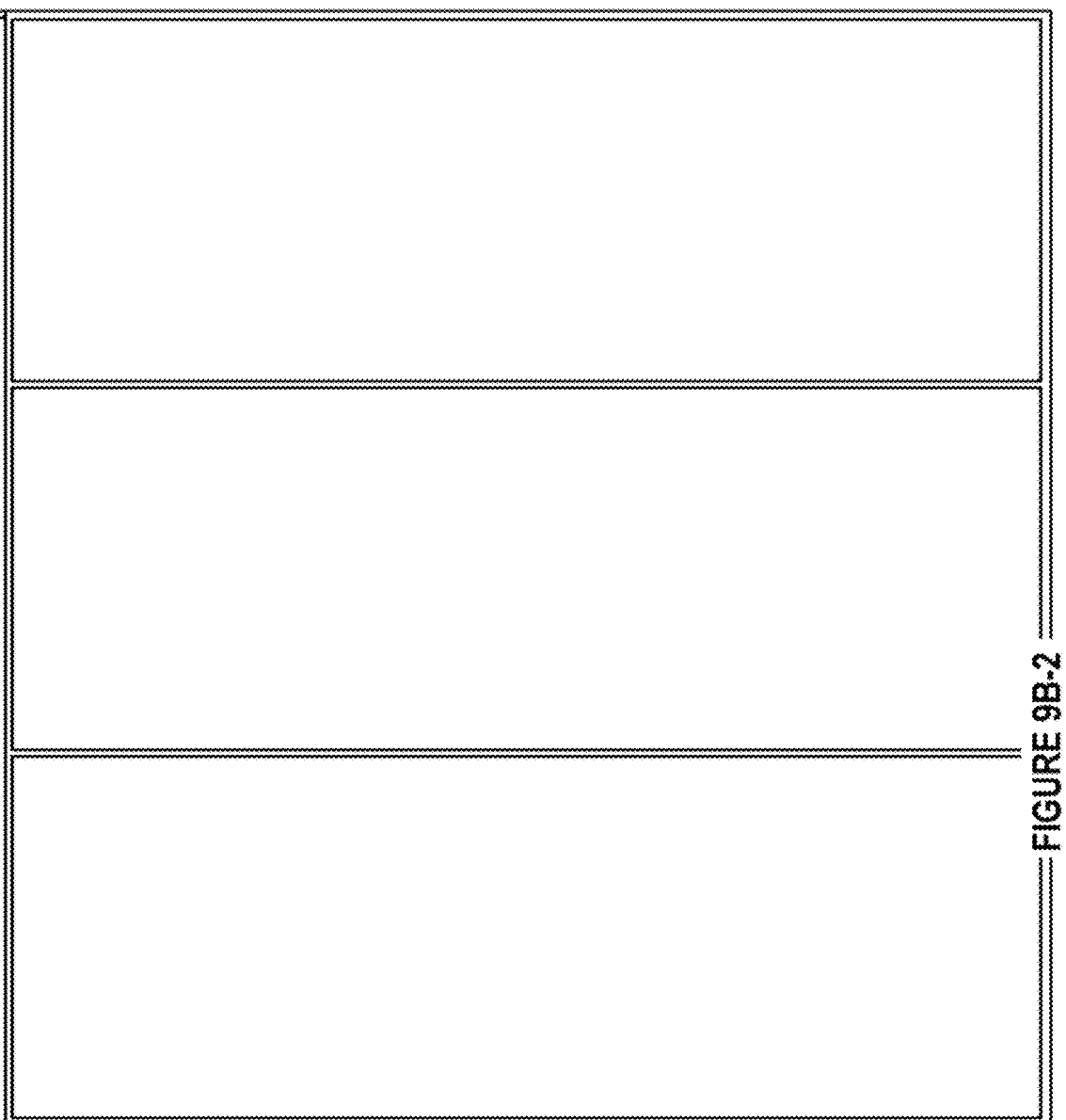

Copyright Fred Cohen, 2022-2023
[Portions US Pub.Pat. Pend/ TRADE SECRET/Copyright (c) 1987-2003] [GET@127.0.0.1:48544] {Mozilla/5.0 (X11; Ubuntu; Linux x86_64; rv:100.0) Gecko/20100101 Firefox/112.0 on dd.a2.cc} Ward

Synonyms for nothing
["ni", "nix", "nada", "null", "aught", "cipher", "cypher", "goose_egg", "naught", "zero", "zilch", "zip", "zippo"]

MobySynonyms for nothing
a little thing, a nobody, a nothing, aught, bagatelle, blank, cipher, clean slate, common man, dud, dummy, empty space, figurehead, good-for-nothing, goose egg, hardly anything, hollow man, inanity, inessential, insignificancy, jackstraw, lay figure, lightweight, little fellow, little guy, man of straw, marginal matter, matter of indifference, mediocrity, mere nothing, minor matter, nada, naught, nebbish, nichts, nihil, nullity, nil, nix, no great matter, no such thing, no-account, no-good, nobody, nobody one knows, nonentity, nothing at all, nothing in particular, nothing on earth, nothing to signify, nothing whatever, nothingness, nought, nullity, obscurity, ought, paltry affair, peanuts, peu de chose, pip-squeak, punk, puppet, pushover, rien du tout, runt, scarcely anything, scrub, shrimp, small fry, small potato, small potatoes, squirt, squit, tabula rasa, technicality, thing of naught, trifle, unworthy, vacuum, valueless, void, whiffet, whippersnapper, wind, zero, zilch

POS for nothing
Pronoun | Adverb | Noun

Synonyms for you
[ ]

MobySynonyms for you
I, myself, after, alter ego, alterum, better self, ego, ethical self, he, her, herself, him, himself, inner man, inner self, I, me, my humble self, myself, number one, oneself, other self, ourselves, self, she, subconscious self, subliminal self, superego, them, themselves, they, yours truly, yourself, yourselves

POS for you
Pronoun | Noun

Synonyms for have
["rich person", "wealthy person", "give birth", "deliver", "bear", "birth", "suffer", "sustain", "get", "get", "let", "experience", "induce", "stimulate", "cause", "get", "make", "consume", "ingest", "take in", "take",

FIGURE 9C

First a quick table from marketing and advertising field identifying the content of different sorts of verbiage and the powerful words they used to instill different feelings in readers.

| Dictionary | Count | %age of content |
|---|---|---|
| Emotional Marketing Value (EMV) | 0 | 0% |
| Fear Power | 0 | 0% |
| Encouragement Power | 0 | 0% |
| Lustful Power | 0 | 0% |
| Anger Power | 0 | 0% |
| Money Power | 1 | 20% |
| before | | |
| Safety Power | 0 | 0% |
| Forbidden Power | 0 | 0% |

Analysis of the provided text
Background

The following analysis of the Big 5 and subcomponents is based on Personality in 100,000 Words: A large-scale analysis of personality and word use among bloggers by Tal Yarkoni University of Colorado at Boulder, and using the Linguistic Inquiry and Word Count, or LIWC (Pennebaker, Francis, & Booth, 2001) dictionary of The Psychological Functions of Function Words by Cindy Chung and James Pennebaker.

The analysis is best when provided with a sample of normal expressive writing in the range of 2,000 words or more. 20,000 words would be much better, and of course, results may vary. The method is based on substantive psychological studies involved subjects given the Big 5 test in different levels of depth and sufficient samples to provide 95% certainty or better with respect to results, with results correlated to LIWC categories against those participants historical blogs containing 20,000 words or more of total volume. The correlates are then applied by searching the input for words against LIWC dictionary entries, counting the number words in each category, dividing them into the total number of words for normalization, multiplying by the correlates from the study for each subcategory, and then using independent correlates to compute a score for each Big 5 category. [Square brackets contain the average of the subfactors.]

FIGURE 9D1

Interpretation

Results should range between -1 and 1, with 1 representing maximum positive correlation (i.e. the component part is indicated to the maximum extent possible), and -1 representing maximum negative correlation (i.e. the component part is contraindicated to the maximum extent possible). For small input sizes (< 2,000 words) results are typically not statistically significant. At 2,000 words, statistics are reasonably valid, and at 20,000 words, they should be far better. Precision (number of digits) in output reflect the size of the input. In this case, The input is 6 words long, so you will get 0 digits of precision. The input has 6 words from the LIWC dictionary, so that will be the basis of rates used.

| Range | -0.50 | -0.40 | -0.30 | -0.20 | -0.10 | 0.00 | 0.10 | 0.20 | 0.30 | 0.40 | 0.50 |
|---|---|---|---|---|---|---|---|---|---|---|---|
| Neuroticism | | | | | | 0 | | | | | |
| Extraversion | | | | | | 0 | | | | | |
| Openness | | | | | | 0 | | | | | |
| Agreeableness | | | | | | 0 | | | | | |
| Conscientiousness | | | | | | 0 | | | | | |

Detailed results

LIWC rates in text

| Dictionary element | Count | Rating |
|---|---|---|
| 1stPerson | 0 | [0] |
| 1stPersonPlural | 0 | [0] |
| 1stPersonSingular | 0 | [0] |
| 2ndPerson | 1 | [0] |
| Achievement | 0 | [0] |
| Affect | 0 | [0] |
| Anger | 0 | [0] |

Results

Neuroticism = 0 [0]
- Anxiety=()
- Anger=()
- Depression=()
- SelfConsciousness=()
- Immoderation=()
- Vulnerability=()

Neuroticism refers to the tendency to experience negative feelings. Those who score high on Neuroticism may experience primarily one specific negative feeling such as anxiety, anger, or depression, but are likely to experience several of these emotions. People high in Neuroticism are emotionally reactive. They respond emotionally to events that would not affect most people, and their reactions tend to be more intense than normal. They are more likely to interpret ordinary situations as threatening, and minor frustrations as hopelessly difficult. Their negative emotional reactions tend to persist for unusually long periods of time, which means they are often in a bad mood. These problems in emotional regulation can diminish a neurotic's ability to think clearly, make decisions, and cope effectively with stress.

FIGURE 9D2-1
TO FIGURE 9D2-2

FROM FIG. 9D2-1

| | | |
|---|---|---|
| Anxiety | 0 | [0] |
| Article | 0 | [0] |
| Assent | 0 | [0] |
| BodyStates | 0 | [0] |
| Causation | 0 | [0] |
| Certainty | 0 | [0] |
| CognitiveProcesses | 0 | [0] |
| Communication | 0 | [0] |
| Death | 0 | [0] |
| Discrepancy | 0 | [0] |
| Down | 0 | [0] |
| Eating | 0 | [0] |

| | |
|---|---|
| [A tendency to easily experience unpleasant emotions such as anxiety, anger, or depression.] | At the other end of the scale, individuals who score low in Neuroticism are less easily upset and are less emotionally reactive. They tend to be calm, emotionally stable, and free from persistent negative feelings. Freedom from negative feelings does not mean that low scorers experience a lot of positive feelings; frequency of positive emotions is a component of the Extroversion domain. |
| Extraversion = 0 [0]<br>Friendliness=0<br>Gregariousness=0<br>Assertiveness=0<br>ActivityLevel=0<br>ExcitementSeeking=0<br>Cheerfulness=0 | Extroversion is marked by pronounced engagement with the external world. Extroverts enjoy being with people, are full of energy, and often experience positive emotions. They tend to be enthusiastic, action-oriented, individuals who are likely to say 'Yes!' or 'Let's go!' to opportunities for excitement in groups they like to talk, assert themselves, and draw attention to themselves. Introverts lack the exuberance, energy, and activity levels of extroverts. They tend to be quiet, low-key, deliberate, and disengaged from the social world. Their lack of social involvement should not be interpreted as shyness or depression; the introvert simply needs. |

FIGURE 9D2-2

COGNOLOGY AND COGNOMETRICS SYSTEM AND METHOD

RELATED APPLICATIONS

This application is a continuation of and claims priority under 35 USC 120 to U.S. patent application Ser. No. 18/232,522 filed Aug. 10, 2023 that in turn claims the benefit under 35 USC 119 (e) to U.S. Provisional Ser. No. 63/464,487 filed May 5, 2023, all of which are incorporated herein by reference.

APPENDICES

This application also includes the following appendices that are all incorporated herein by reference and are all part of the specification as filed:

Appendix A (175 pages)—Time Space Travel Patent Specification;
Appendix B (69 pages)—Inconsistency Patent Specification;
Appendix C (34 pages)—Perturber Patent Specification;
Appendix D1 (16 pages) is source code for CashFlow.pl.
Appendix D2 (30 pages) is source code for Synonyms.HASH.
Appendix D3 (45 pages) is source code for Synonyms.DATA.
Appendix D4 (1 page) is source code for Simulator.pl
Appendix D5 (2 pages) is source code for Word.pl.
Appendix D6 (4 pages) is source code for Sentences.pl
Appendix D7 (6 pages) is source code for SalesSieveSim.pl
Appendix D8 (3 pages) is source code for SalesSieveSettings.pl
Appendix D9 (8 pages) is source code for SalesSieveEdit.pl.
Appendix D10 (13 pages) is source code for SalesSieve.pl.
Appendix D11 (66 pages) is source code for Psycho.pl
Appendix D12 (41 pages) is source code for Psych.txt.
Appendix D13 (20 pages) is source code for POS.HASH
Appendix D14 (37 pages) is source code for POS.DATA
Appendix D15 (93 pages) is source code for MobySynonymns.HASH
Appendix D16 (69 pages) is source code for MobySynonymns.DATA
Appendix D17 (7 pages) is source code for FileHash.pl
Appendix D18 (23 pages) is source code for CashFlowSim.pl
Appendix D19 (1 page) is source code for CashFlowShowTable.pl
Appendix D20 (12 pages) is source code for CashFlowEditMarkov.pl
Appendix D21 (9 pages) is source code for CashFlowEdit.pl Appendix D22 (16 pages) is source code for Sieves.txt.
Appendix E (13 Pages)—[D1] A Note on the Role of Deception in Information Protection, (c) 1998 Fred Cohen, Computers and Security 1999 http://all.net/journal/deception/deception.html.
Appendix F (67 Pages)—[D2] A Framework for Deception by Fred Cohen, Dave Lambert, Charles Preston, Nina Berry, Corbin Stewart, and Eric Thomas.
Appendix G (24 Pages)—[D3] The Use of Deception Techniques: Honeypots and Decoys, Fred Cohen.
Appendix H (12 Pages)—[D4] A Mathematical Structure of Simple Defensive Network Deceptions, Copyright (c) 1999 Fred Cohen, http://all.net/journal/deception/mathdeception/mathdeception.html #footnote-1.
Appendix I (25 Pages)—[D5] Red Teaming Experiments with Deception Technologies, Fred Cohen, Irwin Marin, Jeanne Sappington, Corbin Stewart, and Eric Thomas.
Appendix J (23 Pages)—[Words] Personality in 100,000 Words: A large-scale analysis of personality and word use among bloggers by Tal Yarkoni University of Colorado at Boulder.
Appendix K (22 Pages)—[LIWC] Linguistic Inquiry and Word Count, or LIWC (Pennebaker, Francis, & Booth, 2001) dictionary of The Psychological Functions of Function Words by Cindy Chung and James Pennebaker.
Appendix L (12 Pages)—[Mseg] Yankelovich, Daniel; David Meer (Feb. 6, 2006). "Rediscovering Market Segmentation" (PDF). Harvard Business Review: 1-11. Retrieved 7 Jun. 2011.
Appendix M (12 Pages)—[VALS] Beatty, Sharon E.; Pamela M. Homer; Lynn R. Kahle (1988). "Problems With Vals in International Marketing Research: an Example From an Application of the Empirical Mirror Technique". Advances in Consumer Research. 15:375-380. Retrieved 7 Jun. 2011.
Appendix N (27 Pages)—[Maslow] Maslow, Abraham H. (1943). "A theory of human motivation". Psychological Review. 50 (4): 370—396. CiteSeerX 10.1.1.334.7586. doi: 10.1037/h0054346. hdl: 10983/23610. ISSN 0033-295X. OCLC 1318836].
Appendix O (29 pages) contains a first part of the Influence software source code that was part of the CD appendix of U.S. Pat. No. 8,095,492 and its claimed provisional (60/755,238).
Appendix P (83 pages) contains a second part of the Influence software source code that was part of the CD appendix of U.S. Pat. No. 8,095,492 and its claimed provisional (60/755,238).

BRIEF DESCRIPTION OF THE DRAWINGS

FIG. 4 illustrates an example of a psych-analyzer input interface;
FIGS. 5A-1, 5A-2, 5A-3, 5A-4, 5A-5, 5A-6 and 5B-1, 5B-2 illustrate illustrates an example of the output metrics from the CEO input shown in FIG. 4;
FIG. 6 illustrates an example of a set of communication strategies;
FIG. 7 illustrates an example of a report generated by the system;
FIGS. 8A, 8B, 8C illustrate an example of a memes and expressions user interface generated by the system;
and
FIGS. 9A, 9B-1, 9B-2, 9C, 9D-1, 9D2-1 and 9D2-2 illustrate sample outputs of the Psych.js source code.

DETAILED DESCRIPTION OF ONE OR MORE EMBODIMENTS

Figure 1:
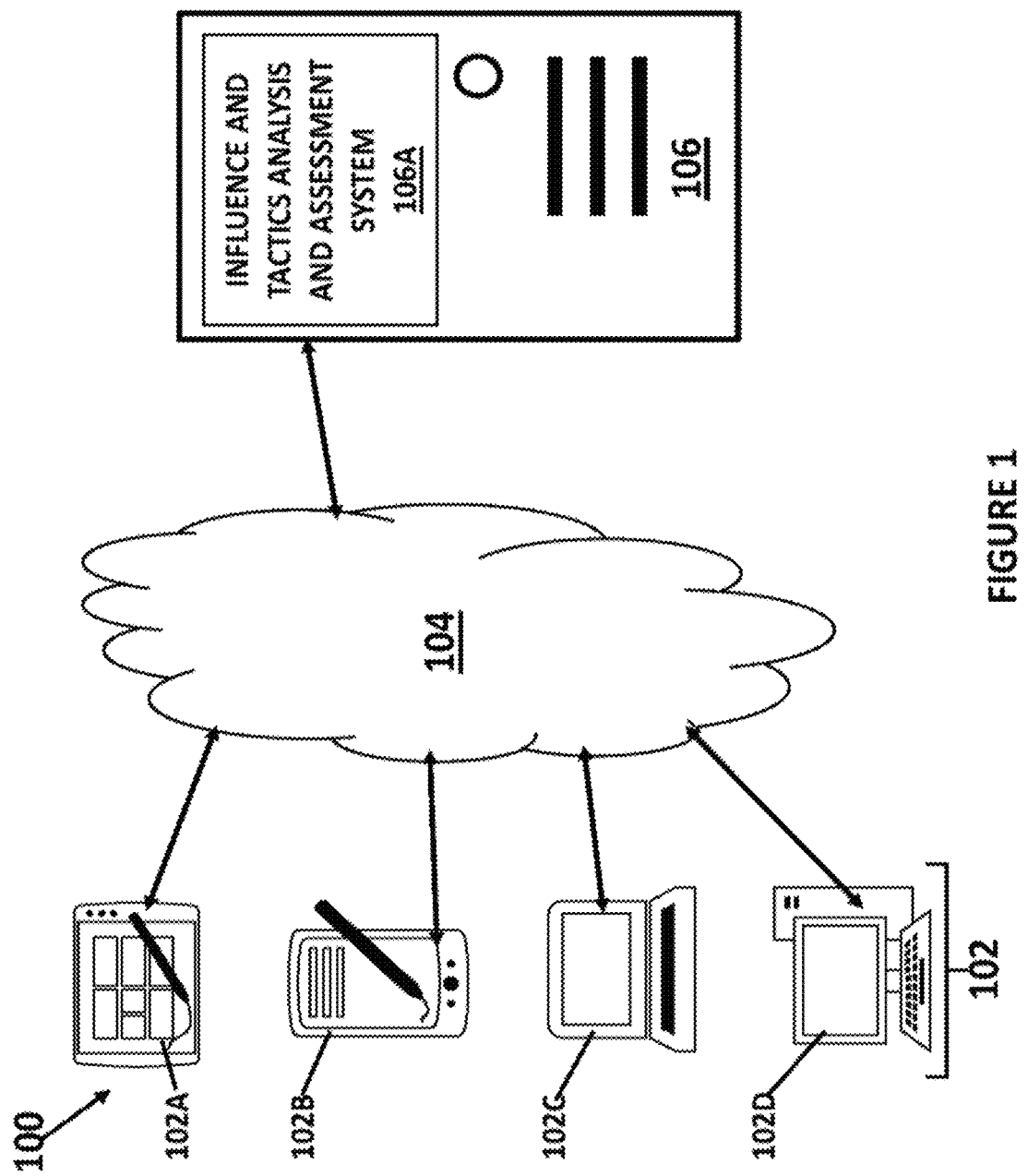
FIG. 1 is a diagram illustrating an example of a computer system that may be used to implement a system for influencing and assessments using cognology and cognometrics.

The disclosure is particularly applicable to using cognimetrics for analysis and assessment using the system and components in FIGS. 1 and 2 and it is in this context that the disclosure will be described. It will be appreciated, however, that the system and method has greater utility since the approaches may be implemented using various known or yet to be developed technologies.

In this disclosure, the terms cognology and cognometrics may be defined by starting with a definition of cognition, which is "refers to the mental action or process of acquiring knowledge and understanding through thought, experience, and the senses." [Oxford Languages Dictionary (herein Oxford)] and which is related to the concept of cognizance, relating to awareness or knowledge. For purposes of this disclosure, this definition may be used more generally in the sense that automated mechanisms, groups of living creatures, and composites such as companies that use automated mechanisms and people together, take actions and undergo processes of acquiring awareness, knowledge, and understanding through processes, experience, and senses. Awareness, knowledge, and understanding in this sense is not a philosophical issue as much as a practical one. From a practical perspective, this indicates reception of signals and response to those signals, whether internally or externally, in an artificial manner, which is to say, not merely through the basic laws of physics, but rather through a more complex process, typically directed toward achieving a goal of the system.

Cognimetrics is the generalization of psychometrics (the science of measuring mental capacities and processes [Oxford]) to a more broadly defined term; the science of measuring cognitive capacities and processes, and the results of applying that science. More specifically, the disclosure is concerned with measurements of observable indicators for the prediction and explanation of behaviors of cognitive systems such as human beings, animals, computer systems and networks, groups, and combinations of those and other cognitive systems. Cognology is the generalization of psychology (the scientific study of the human mind and its functions, especially those affecting behavior in a given context [Oxford]) to the study of cognitive systems and their functions, especially those effecting behavior in a given context.

The development of cognimetrics has been underway since the before the founding of the field of psychology, the understanding of situations in warfare [Sun Tzu], and the development of automated machines for weaving. Over time many theories have come and gone, and as the fields of psychology and psychiatry developed, scientific rigor was increasingly applied to understanding human beings. Similarly, organizational psychology applied methodologies to explaining and predicting the behavior of organizations, which include people and systems they use to perform tasks. The behavior of automated systems from external behaviors is sometimes referred to as black box testing. Animal behavior is explained and predicted by what is called animal psychology. In the information age, cognimetric studies of behaviors of people, groups, and automation mixed together are a part of research on such various fields as intelligence and counterintelligence, political influence campaigns, riot control, educational effectiveness, and in many other areas of interest.

The Big 5 personality test became widely used for evaluating personality characteristics of individuals and has been widely used for many years for the study of personality, at a minimum as a standard against which to measure. In the time frame of 2000, cognology started to look more seriously at deriving psychological understanding of personality from text written by individuals, and in particular, the use of techniques such as Linguistic Inquiry and Word Count (LIWC) [LIWC, Words appendices] This research ultimately led to many paths to adoption, ranging from the development of analysis of headlines for sales purposes and its use to increase the specific emotions desired to trigger action in advertising targets, to significant research into areas like turning behavior [DARPA ADAMS] and social media influence operations. [DARPA SMISC] Other behavioral characteristics such as footfall analysis, voice analysis, speech pattern analysis, and so forth have also grown over time for use in forensics or other similar areas. And in the broader arena of cognology, metrics have been applied to a wide range of living and artificial mechanisms producing cognimetrics for animal behaviors and automated systems.

The development of new methods of so-called generative artificial intelligence increasingly applied the massive available text online to generating new text by a multitude of methods such as statistical selection of the next word based on frequencies of word pairs and longer sequences, the use of neural networks for creating weightings of text and images in very high dimensional spaces with billions or more parameters, the generation of sentences, phrases, paragraphs, and larger bodies of written text in different styles, and similar methods now being used in products such as ChatGPT and BARD. This has co-developed with related cognimetrics which are required in order to perform sensible generation using today's methods.

The origin of such methods stems from early work on generating music, poetry, and text by computers in the 1960s. Sentence structure, for example, is used to generate sequences of words from a dictionary of words, so that sentences like "The chair walked over a jar." Are generated from a template of [Article, Noun, Verb, Adjective, Article, Noun] with capitalization of the first word and a terminating "." character. Random generation of words by random selection from a dictionary is used to create a sentence like the example. By using subsets of each type and relating subsets to each other, more realistic sentences are generated. For example [The/A] [car/motorcycle/bicycle/ . . . ] [rolled/rode] [over/on/toward/near] . . . and so forth will produce sensible sentences of a more restricted form. Adding additional information regarding relationships (e.g., wheel is associated with the verb roll and the nouns car, motorcycle, etc.) sentences may be less restricted and remain reasonably sensible. These associations may be written by a human author, or in the case of larger scale generation, from graphs generated from samples of existing written works. This was done, for example in the speech understanding work related to project hearsay in the 1970s. The available quantity of texts for this analysis grew dramatically with the advent of the World Wide Web in the 1990s, and with the growth of large search engines such as Google, vast amounts of text became available for analysis. Many methods of identifying word sense in context, relationships between terms, and other similar aspects of language grew as larger scale computation was available for the analysis of existing texts to generate cognimetrics. Without the development of cognimetrics, generative AI could not grow, because the metrics drove the automated generation capabilities at scale while humans seeking to generate all possible sequences would take too many resources and too much time. Without the vast amounts of data resulting from Web search engines collecting data from enormous volumes of human generated content, cognimetrics could not generate the results in current generative AI.

There are down sides to these technologies. In particular, and without limit, from the generation methods; their ability to create convincing text and images is increasing rapidly, to the point where text today seems like it was generated based on real information, when the text presents information that is patently false when compared to reality or even internally inconsistent; their ability to create convincing audio and video sequences to the point where today these are given the term of art "deep fakes", because the content was never actually spoken or acted out by the apparent presenter; their ability to assist in the creation of software that has the potential to attack computer systems by individuals with almost no skills in computer programming; and so forth.

Not all applications require such vast efforts. The same underlying techniques stemming from cognology and cognimetrics have been used at far smaller scale to develop many other similar technologies over time, directed at applications ranging from automated telephone answering and response to medical diagnosis. The number of examples of this today is staggering, and adoption rates are extremely high. From classical statistical analysis methods, techniques support the ability to associate values to characteristics of people and groups automatically based on their text, speech, and other behaviors. In combination, these methods have been used to produce real-time analysis of human behaviors such as search term usage to generate real-time advertising copy and similar information in order to get people over the action threshold to purchase items online or in person, and to generate increased effectiveness for committing frauds at massive scales.

As a means of social influence, these techniques have started to be used for efforts ranging from group influences that create and suppress violent clashes; through social manipulation of the body politic of nation states.

However, to date, these combined methods have been performed by human beings applying statistical or other similar models, and not based on the analysis of cognimetrics such as LIWC or sentiment analysis or generated outbound communications based on techniques like VALS assessments [Mseg, CBM, VALS] and the Maslow hierarchy identification [Maslow appendix] through systematic influence analysis and decision-making methods or with feedback used to produce and measure influence operations automatically, except in the application of the patents incorporated by reference into this application.

At a technical level, deception technologies in computer systems and networks have been used to induce and suppress signals to increase the workload of attackers and cause them to gain incorrect information leading to incorrect conclusions about content and makeup of systems and networks [D1, D2, D3, D4, D5 appendices].

However, to date, these automated response mechanisms have not taken into account psychological factors associated with threat actors and groups in an automated manner, but have relied in human judgment and design to produce such responses in real-time from predetermined decisions built into the mechanisms. Similar approaches have been used in other fields of endeavor related to cognimetrics and cognology, but again, systems and methods for systematically applying cognimetrics and cognology toward gathering information about a target, evaluating with cognimetrics, decision-making regarding actions to take, generating content, and presenting it to a Target, then analyzing the results in an ongoing fashion have not arisen outside of the context of the patents incorporated by reference in this application.

FIG. 1 is a diagram illustrating an example of a computer system 100 that may be used to implement a system for influencing and assessments using cognology and cognimetrics. The system may have one or more computing devices 102 which are used by a user of the system to input data and receive outputs (assessments, etc.) from a backend 106 by communicating over a communication path 104 as shown in FIG. 1. Each computing device 102 may have at least one processor that executes instructions and executed a known browser application to interact with the backend 106. Each computing device may be a device having at least one processor, memory, a display and a communications element that allows the computing device to connect to and communicate over the communication path 104. Examples of the computing device 102 may include a tablet computer device 102A, such as an Apple® iPad® or Microsoft® Surface®, a smartphone device 102B, such as an Apple® iPhone® or Android® operating system based device, a laptop computer 102C and/or a personal computer system 102D as shown in FIG. 1. Each of the computing device may receive data from the backend 106 (user interfaces requesting data, user interfaces presenting analysis or assessments, etc.) that may be displayed on the display of the computing device.

The communication path 104 may be a secure or unsecure communications that uses known or yet to be developed connection protocols and data communications protocols to permit the computing devices 102 and backend 106 to communication and exchange data. The communication path 104 may be a wired network (ethernet, DSL, copper wire, etc.) or a wireless network (cellular digital data network, computer network, WiFi, LAN, WAN, etc.) or a combination thereof.

The backend 106 performs the analysis and assessments based on cognimetric information for each user (based partially on the input(s) provided by each user) and returns the analysis and/or assessments to each user for display on each computing device 102. The backend 106 may be implemented using cloud computing components, such as Amazon® web services (AWS) servers, but may also be implemented using other computer architectures and techniques. In one implementation, the cloud computing resources may be blade server, server computers, application servers, etc. that have at least one process that can execute instructions, such as the instructions for the processes/components shown in FIG. 2. The backend 106 may include an influence and tactics analysis and assessment system 106A that is executed on at least one processor of the cloud computing components wherein the influence and tactics analysis and assessment system 106A is implemented as a plurality of instructions (lines of code) that are executed by the at least one processor of the cloud computing resources so that the processor is configured to perform the operations of the influence and tactics analysis and assessment system 106A as discussed below.

Figure 2:
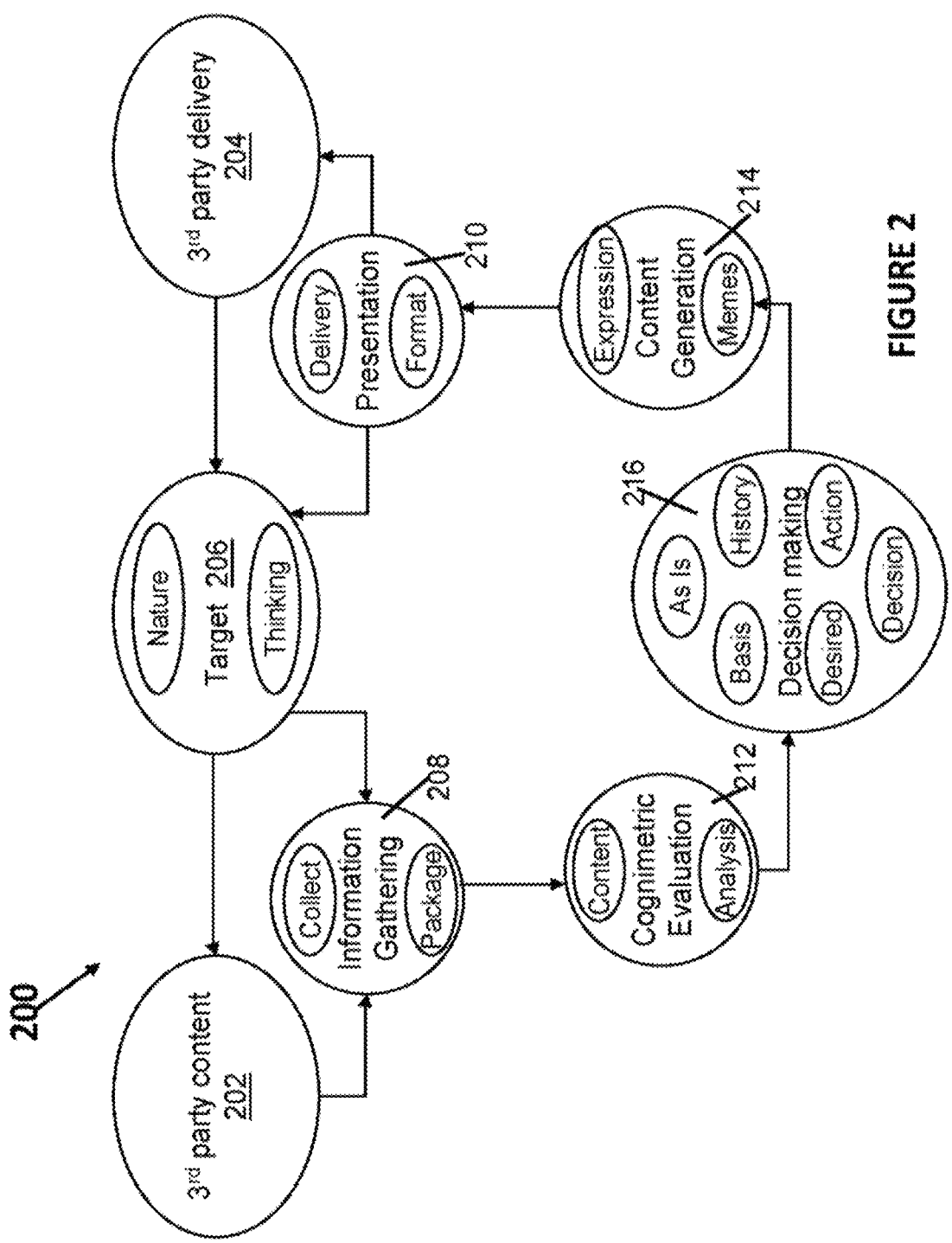
FIG. 2 is a diagram of an interaction of the elements in FIG. 1.

FIG. 2 is a diagram of an interaction of the elements in FIG. 1 and of the processes 200 performed by the influence and tactics analysis and assessment system 106A. Each of the processes shown in FIG. 2 may be performed by the backend 106 shown in FIG. 1. The processes may receive third party or user content 202 and may deliver analysis and assessments to third parties or users 204 and may include targets 206 of interest. The processes performed may include information gathering 208, presentation 210, cognimetric evaluation 212, content generation 214 and decision making 216 each of which are discussed below. Each of these processes/components may be implemented as a plurality of lines of instructions/computer code that are executed by a processor of the backend computer system so that the process is configured to perform the functions and operations of each process.

The system and method are directed at the use of influence strategy and tactics analysis based on cognimetric information collected by automated means analyzed by decision analysis for producing outputs directed toward influencing actors to undertake acts, and the observation of resulting behaviors for generation of subsequent analysis and generation so as to create a feedback system that adapts with time applying the methods of cognology analysis.

The one more targets (206) of influence have a Nature shown in FIG. 2, in the form of personality for humans, operating environment and embedded mechanisms for computers, culture for groups, and so forth that combine with current Thinking shown in FIG. 2, in the form of brain function for humans and biological entities, state and processes for computers, group cognitive processes for groups, and so forth to produce behaviors and adapt their perception to comprehend their situation and context. As a simple example, a frog tossed in very hot water will perceive the heat and jump out.

Target perception comes from signals received and mechanisms of interpretation based on comprehension in context. These signals come from the environment in which the target senses, and such signals in the environment may be induced and/or suppressed by external actors, either directly by the present invention or indirectly through 3rd parties by the present invention. As a simple example, a target computer may receive wave forms at an interface to a network and because of its 'focus of attention', only perform processing on such signals as are addressed to its current network address. Other computers sharing the same physical medium may induce signals that are perceived by the computer and acted upon and may alter the medium so as to cause signals intended for the target to be perceived by the target as not directed toward it and thus cause the target to miss those signals. Similarly, Targets produce behaviors that may be observed directly or through 3rd parties in the form of information and signals produced by the target as they effect the target's environment. As a simple example, a Target person may send an email directly to the system, may send a text message to a 3rd party, or might be arrested and the 3rd party police record may be available to the system as third party content 202.

Information Gathering 208

The system and method are comprised of one or more major components, each with one or more subcomponents, depending on the particulars of the embodiment. The major components and their subcomponents including Information gathering (208) which is the manner in which behaviors of Targets 206 are input to and reach the system for analysis and assessment. The information gathering includes collection which is the way the system and method gets information regarding Target behaviors. As a simple example, that Target may speak and the system may have a microphone that receives that speech as waveforms transmitted through movement of air. There are of course many direct and indirect paths from Target behaviors to ways the system may collect such information. As will, after this disclosure and without undue experimentation, be readily apparent to a person of ordinary skill in the art, there are many different ways in which collection may take place, many different sources and sorts of indicators that result directly or indirectly from behaviors of the Target, many paths from the Target to the collection mechanisms, and many different mechanisms of collection that may be used. The information gathering 208 includes packaging which is the way the collected information is formatted, processed, and/or transformed within the system and method for further use by the system or method. As a simple example, received speech may be packaged as a file in the MP3 format, or it may be processed through voice to text recognition, or multiple sets of such information may be combined for use in the system and/or method. As will, after this disclosure and without undue experimentation, be readily apparent to a person of ordinary skill in the art, there are many different ways in which collected information may be processed, transformed, and/or formatted for use by the system and method and many ways in which such information may be made available for use by the rest of the system.

Cognimetric Evaluation 212

Another process is the cognimetric evaluation 212 that is the way gathered information is turned into the situational information (as-is) required for decision-making by the system. Content for this process is the relevant and useful aspect or portion of the gathered information for the specific processing being undertaken. As a simple example, in an email message, the count of words used would be the relevant and useful part for analysis by the Linguistic Inquiry and Word Count (LIWC) method of generating psychometric values relative to the Big 5 personality profile, while the header details of the message in sequence would be a relevant and useful part of the same message for relative to generating psychometric values for the consistency analysis of messages in attributing them to one of multiple Targets being addressed by the system and method. As will, after this disclosure and without undue experimentation, be readily apparent to a person of ordinary skill in the art, there are many different ways in which different packaging of different collected information from different sources might be used to produce different content for different analysis techniques. The Analysis of this process shown in FIG. 2 is the processing of appropriately selected and produced content for generating situational information required for decision-making. As simple examples, the LIWC and consistency analysis approaches identified for Content are different analysis approaches producing different psychometric information for Targets. The LIWC analysis approach produces numerical values ranging from −1 to 1 for each of 5 major personality characteristics and each of those containing numerical values of multiple sub-components as well as counts of different word senses. The consistency analysis produces any of a number of different values of different sorts depending on specifics of the analysis being performed, for example, including a simple-1 to 1 range of values for consistency between and within different traces such as testimonial evidence and computerized records of activities or locations over time. As will, after this disclosure and without undue experimentation, be readily apparent to a person of ordinary skill in the art, there are many different ways in which different analysis techniques may apply to the generation of cognimetrics for different situations, content, and decision-making approaches. [SW-LIWC in Appendix].

Decision Making 216

The decision making 216 is used to determine actions to take in order to influence the future actions of the Target 206. A current situation (As-Is shown in FIG. 2) reflects the combination of stored or provided information on the situation with incoming cognimetrics and content resulting from analysis. As a simple example, a current situation might be described by stored values from previous influence operations regarding the same target, which is inherently historical in nature, and current information provided by the psychometric evaluation process, such as the output values produced by LIWC or consistency analysis, possibly in conjunction with the content used to produce these values or other related analytical results or information. As will, after this disclosure and without undue experimentation, be readily apparent to a person of ordinary skill in the art, there are many different types and forms of situational information that may result from content and the generation of cognimetrics for different situations, and that such situations may reflect the sequence of situations over time.

The Decisions for this process shown in FIG. 2 reflect, at their essence, the selection of options from a set of alternatives. There must be a finite number (of alternatives) and number of options selected from the available totality of options, at least for any digital system, if only because such systems are finite state automata. They must exist prior to the completion of the decision-making process or they cannot be selected. These decisions may be of many different sorts, for example, and without limit: 1) Objective-Subjective: Is the decision process Objective, Subjective, or a combination of both?; 2) Quantitative-Qualitative: Is the decision process based on Qualitative or Quantitative data or Both?; 3) Nominal-Ordinal-Interval-Ratio: What sort of metrics are available or desired for this decision making process?; 4) Hierarchical-Flat: Is the decision space hierarchical or flat?; 5) Simple-Complex: Is the decision simple or complex?; 6) Explanatory-Predictive: Is the decision process designed to explain what is or predict what will be?; 7) Group-Individual: Is the decision process for individual decision makers or decisions made by groups?; 8) Casual-Formal: Is the decision formalized or ad-hoc?; 9) Text-Visualization: Is the decision presented and analyzed in a text or visualization format?; 10) Strategic-Tactical: Is the decision a local or overarching decision?; 11) Optimizing-Satisficing: Is the decision model decision optimizing, satisficing, incremental, cybernetic, or random; 12) Supply-Demand: Is the decision process driven by communications, data, models, knowledge, or users?; 13) Evaluation-Criteria: What are the evaluation criteria used?; 14) Tempo: What is the interaction rate and tempo of decision-making?; 15) Amplitude-Architecture: Are the decisions related to differences in kind or magnitude?; 16) Designed: Is the decision process designed and programmed or ad-hoc?; 17) Personal: Is the decision personal to the individual or group, or related to work or business?; 18) Expertise: What should the expertise level of the decision maker be?; 19) Static or Dynamic: Is the decision process static or dynamic?; and/or 20) Single or Multiple Intentions: Is the decision in cooperation or competition with other decision makers?

As a simple example, a decision might be to select a specific communications approach comprised of several aspects like frequency of communication, referring them to 3rd party experts, hiding financial information from them, and so forth; based on cognimetrics regarding personality traits and other situational information about a Target person such as their position in a group or company, their funding profile, likability, and so forth; in order to meet a goal of reducing their interest or affinity to in a particular project. As will, after this disclosure and without undue experimentation, be readily apparent to a person of ordinary skill in the art, there are many different types and forms of decisions and specific decisions of these sorts that may be made involving a wide variety of cognimetrics and situations, and that such decisions can be made using any number of automated techniques such as rule sets, conditionals, table lookups, database lookups, or any of the more modern approaches such as using network analysis techniques, relational networks, so-called artificial intelligence methods, and so forth.

The Basis for decision shown in FIG. 2 is the underlying methodology behind the making of the decision. The term "methodology" here is not necessarily implying a logical-based analytical framework. For example, the basis may be statistical collections of historical decisions based on different situations, dice rolls or other random selection methods, game theoretic analysis, analytical processes which take into account inconsistencies, random generation and selection for evaluative properties such as change in psychometric values, and complex combinations of these or similar things. As a simple example, a high dimensional matrix developed by taking large numbers of samples of similar content and analysis resulting from previous application of the system analysis would allow for a feedback system that "learns" over time to improve some objective function. As will, after this disclosure and without undue experimentation, be readily apparent to a person of ordinary skill in the art, there are many different types and forms of bases for decisions, and the bases for decisions will be related to the decisions so that a basis can be identified for such decisions. The basis may be explicitly described or inherent in the embodiment, but it can be identified by the decisions involved in the creation of the decisions applied, even if such decisions were merely to roll the dice or use what some other party used for some other purpose before.

The Historical context (situation or History) may be part of the current situation in the sense that it offers the context for making the decision by providing information used in the decision-making process that would not be directly available from the content and results of analysis alone. A simple example would be a location in a multidimensional matrix representing characteristics of a Target previously produced by evaluation, by a user inputting an initial state, or by a default initial state, where such location is changed based on actions taken (i.e., through influences produced by decision-making) and observations made (i.e., sourced by psychometric evaluation) over time. As will, after this disclosure and without undue experimentation, be readily apparent to a person of ordinary skill in the art, there are many different types and forms of storage that may be used to store many different sorts and forms of historical context regarding different situations.

The Desired situation for this process in FIG. 2 is what may be thought of as the objective function of the decision-making process or in a human sense, the result of wishful thinking. It can, but need not be, characterized in terms of the psychometric input sequences that are desired in the future, which translates then, through notionally reversing the process of their generation, to the information gathered, which translates then notionally again into the behaviors of the Target. In other terms, these are the measurable results of the desired behaviors of the Target. As a simple example, the desired situation for the Target(s) of a sequence of influence actions for supporting a decision in a group (the Target) might be that all decision-makers in the group (individual Targets) are measured as favorable toward the desired outcome ff they view it as of more than minimal important. In the metric expression of these values, this might translate into a center of gravity in the upper right hand corner of two dimensional metric space (such as the space associated with the "Influence" patent). As will, after this disclosure and without undue experimentation, be readily apparent to a person of ordinary skill in the art, there are many different such measurable results that might be applied for different decision making components described here and many different criteria that might be established as desired situations.

The action of the decision-making shown in FIG. 2 expresses the specific influence actions to be taken (recommended influence actions) as the result of a decision. This may be inherently described by the decision outcome, such as an outcome that includes the words to be stated to the Target, or might be less direct or even in the form of a set of values to be sent to the content generation mechanism. A simple example is an output listing a set of characteristics of a Target, such as the lifestyle outputs of a VALS assessment or Mazlow's hierarchy description. As will, after this disclosure and without undue experimentation, be readily apparent to a person of ordinary skill in the art, there are many different such actions that may be produced by a decision process and any number of ways such results might be post-processed to turn them into output suitable for input by different content generation mechanisms.

Content Generation 214

The Content generation 214 is the way actions are translated into expressions that are deployable through communications to 3rd part delivery mechanisms 204 or the Target (s) 206 by the presentation process/mechanisms 210.

Memes are the underlying "thoughts in the heads" of the Target. By this we mean the mental constructs we want people to build internally so as to get them to behave differently, or in the case of an animal, the similar sorts of concepts animal psychological studies have identified with them, or in the case of computers or groups of people or groups of people and computers working together, and so forth, the applicable sorts of concepts associated with them by the various fields of study. As a simple example, some dogs focus their attention on food or toys or sounds or smells or other sensory inputs over others. A dog that wants something to hold in its mouth will focus attention on a favorite toy above other things, allowing the focus of attention to be on that toy rather than another dog walking on the same street. The meme here might be 'distract with toy', assuming the content generation mechanism 214 can accept that as input and generate an expression that will cause a desired presentation of the toy to the dog. As will, after this disclosure and without undue experimentation, be readily apparent to a person of ordinary skill in the art, there are many different such memes that may be produced by decision-making that will result in expressions in many different forms depending on the mechanisms in use.

Expressions (part of the content generation 214) are the material used to present actions to targets or through 3rd party delivery to Targets. As a simple example, a meme of "redirect DNS of Name.Com to 1.2.3.4" might be turned into an expression in the form of a small computer program that, if run in the proper operating environment, will deliver a series of datagrams appropriate to that action to a Target computer (i.e., a series of DNS replies) as part of a deceptive influence to get the Target to change its behavior (i.e., by using a wrong association of a domain name into an IP address the Target will transmit to the wrong address and it will not affect our computers). As will, after this disclosure and without undue experimentation, be readily apparent to a person of ordinary skill in the art, there are many different such expressions appropriate to different circumstances, and the transformation of memes into expressions that operate within the context of a presentation mechanism will vary and be specific to the presentation mechanism in use.

Content Presentation 210

The Content presentation acts on expressed content to cause that content to be delivered to the Target 206. The Format function is the mechanism that produces the form in which expressions are delivered to the Target are described. They may be expressed as sounds, written words, pictures, software packages, datagrams, wave forms, and so forth. As a simple example, the format for delivery of a sound to a Target may be a combination of an identifier for the delivery mechanisms (e.g., the phone number of the Target's cell phone) and the sequence of emissions to be played by that cell phone (e.g., a.wav file), these intended to be deployed by the delivery mechanism. Similarly, the format might identify multiple possible delivery mechanisms such as a cell phone version, an email version, a text messaging version, and so forth, so that delivery may be accomplished by more than one delivery mechanism, and include indicators of multiple delivery, fastest delivery, any available delivery, and so forth. As will, after this disclosure and without undue experimentation, be readily apparent to a person of ordinary skill in the art, many different embodiments are feasible for many different delivery mechanisms, each requiring a format compatible with the delivery mechanism associated with delivery to the Target.

The Delivery in the presentation 210 is the way by which signals are induced and/or suppressed. As simple examples, a picture may be projected on a wall outside a target's home, attached to an email sent to an person or members of a group, delivered via social media texts, etc. As will, after this disclosure and without undue experimentation, be readily apparent to a person of ordinary skill in the art, many different delivery mechanisms may be used, some through 3rd parties such as email service providers others through physical actions of a robotic device, others through human beings such as drivers in a delivery service.

EXAMPLE EMBODIMENTS

As will, after this disclosure and without undue experimentation, be readily apparent to a person of ordinary skill in the art, the parts/processes shown in FIG. 2 have to fit together in order for the system and method to operate with effect. The simple examples of the descriptions above described sets of parts that could not be combined as they are to form an operable mechanism with all of the information gathering, cognimetric evaluation, decision making, content generation, and presentation components presented, because they are examples of different aspects of the system and method applicable to different situations and embodiments. For example, presenting a toy to a dog will not likely operate through a meme like "redirect DNS of Name.Com to 1.2.3.4", and the cognimetrics associated with LIWC are unlikely to be part of a system to interpret the dog's behaviors since dogs do not speak in human language and the Big 5 is associated with human psychology and not animal psychology. As such, it is necessary for the use of the system that the embodiment be composed of compatible components. The selection of components and their elements and interconnections within and between them are common practice in the art today. As a simple example, the evaluation of incoming information in the form of sounds collected through a microphone may be connected any of a number of existing or newly created speech recognition systems to turn the original information into phonemes which are assembled using network graphs of likely speech patterns to produce textual (speech to text) output and also fed to recognition mechanisms to associate the wave forms with one of a small number of targets and packaged along with metadata such as time and IP address of the source and text also provided in the same social media posting using application program interfaces to databases which are then delivered by providing a universal resource indicator to the cognitive evaluation component. The results may be organized as content of different sorts, such as frequencies over time and sequences of words for cognimetric analysis for stress levels and word usage for sentiment analysis, again by taking the output of each step and formatting it for input to the next step, and placing the results in a JSON or other similar format for transmission to the decision-making component along with the same URI used to provide the packaged gathered information to cognimetric evaluation.

Decision-making of different sorts are detailed in example embodiments from previous patents including [Decider], [Influence], and [Scalable] (see priority claims and appendix section above). Action outputs from decision-making might be stored in memory and be made available to content generation there, or otherwise transmitted to or shared with the content generation component. Memes in the form of sentence fragments may be generated from a pre-defined set of fragments, by the use of generative AI techniques such as those disclosed above or others developed over time, or by other means. The expressions of those memes may again be informed of the memes through mechanisms already identified, such as memory sharing, databases, transmission through messages, and so forth. Expressions may be generated, for example in this case, by creating sentences using the methods disclosed above or by other methods as may be selected from available methods. Communication of these expressions for presentation may proceed in a manner similar to the means used to communicate between components already described or by any other means readily available and suited to the performance requirements of the particular system. Formatting for presentation may be done taking standard approaches to production of content in different formats, such as removal of special characters, limiting length, adding hash tags, and so forth for social media. Delivery by the methods by which other information is presented to Targets through the social media or other channels may involve the use of specific network protocols such as TCP and following Internet Request For Comments (RFCs) such as RFC793 for TCP connections to the social media provider, and so forth. One or more of these steps may be augmented by the use of human or other external mechanisms, depending on time and other system constraints, that provide additional information and observe partial results or other situational information at any point, such interactions involving additional interfaces to connect to those other human or mechanisms. While this set of activities may take substantial time and effort and involve a lot of testing to make sure the mechanisms operate as intended and to debug the code or components involved, substantial experimentation is not required in order to implement such a system, in this example, or in other similar sorts of applications. Some sample embodiments are provided here at a high level, and some more specific embodiments are provided in more detail herein, with the understanding that these are only examples and do not limit the scope of the disclosure.

Example 1: Sales and Marketing Assistance

In this example embodiment, information gathering 208 on markets and market segments is collected and packaged into content in the form of identifying resources and key motivations for each market segment and collected statistics from 3rd parties, such as statistics from the finance department on sales to specific Target customers and groups.

Figure 9A:
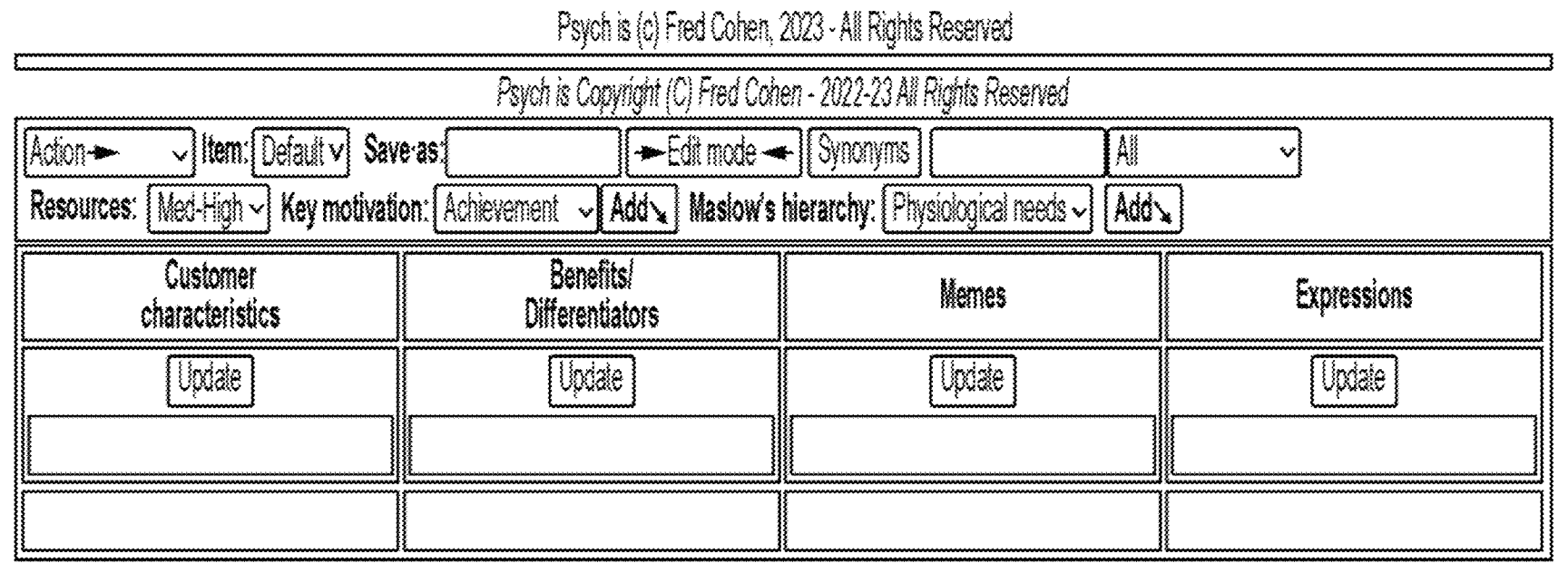
Figure 9B-1:
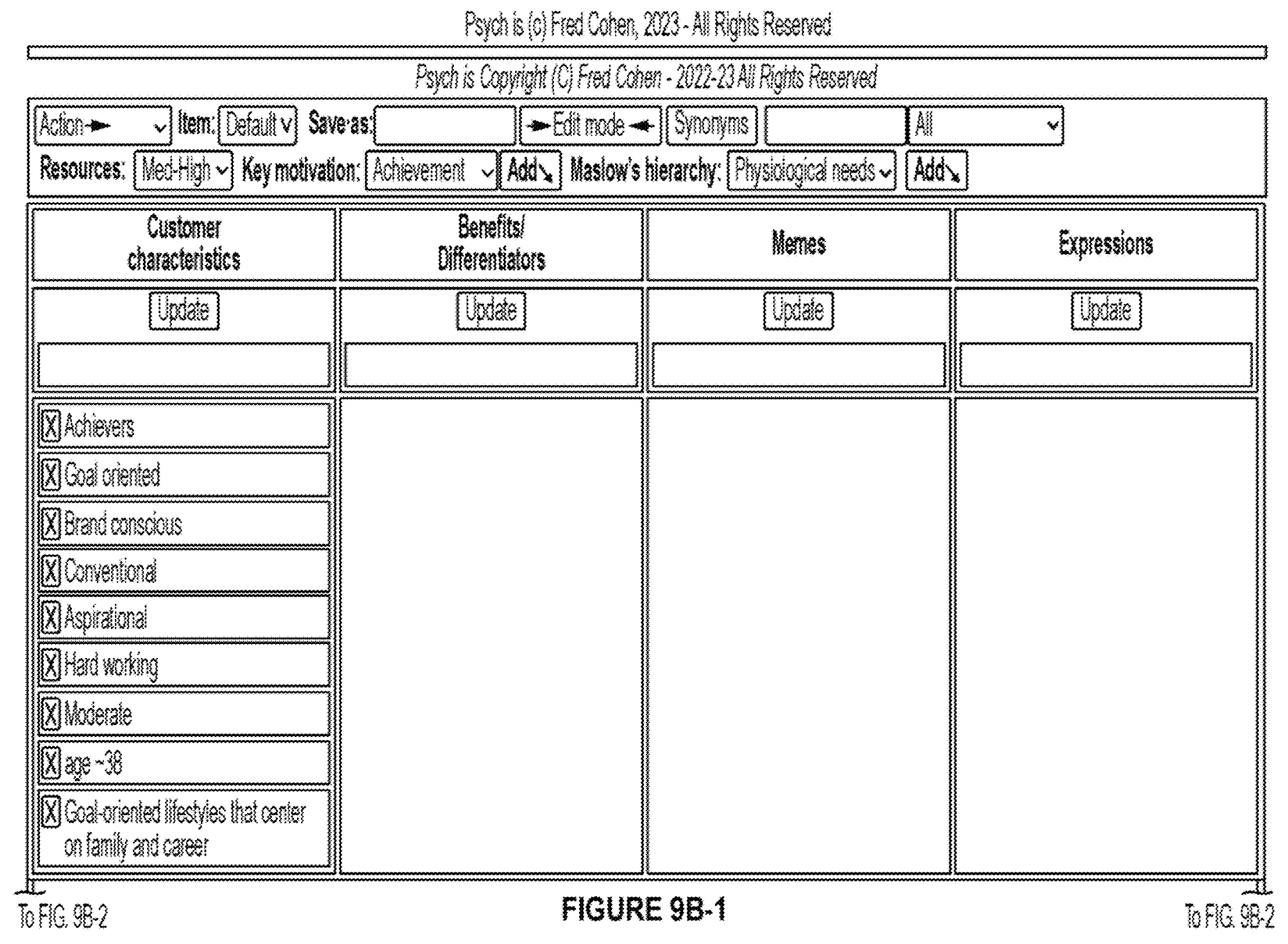

The key motivations and resources for a market segment are analyzed for cognimetrics (212) using an automated VALS assessment generated, for example, by the Psych.js source code. See Appendix D and specifically the Psych.js source code in Appendix D which produces a set of descriptions of different characteristics of the Target 206 and FIGS. 9A-9D illustrate sample outputs of the Psych.js source code. In particular, FIG. 9A illustrates an example of the initial user interface generated by Psych.js while FIG. 9B shows the user interface generated by Psych.js when a user clicks on "Add" to get the VALS assessment result shown in FIG. 9B. FIG. 9C shows an example of the synonym analysis discussed in more detail below in paragraph 0066. FIGS. 9D1 and 9d2 show an example of the user interface showing the metrics on word selection (partial output of Psych.pl) using LIWC related to Big 5.

These pieces of data are fed into a decision-making process 216 that seeks to identify matches between the VALS results and differentiation for the products or services offered by a company or business unit. The desired outcome is an objective number or value from sales into each market segment. The As-Is information includes the current differentiating factors for the product and service offerings. The history includes the history of sales including the specific history of progress in a sales sieve describing the sales process and other similar information on how customers buy, product placement, and other similar factors. The decision is the selection of future memes which is done by associating benefits with customer cognimetrics and matching applicable sets of benefits for each customer characteristic. For characteristics without and associated benefit, those characteristics are not further processed at this step. Each of the identified future memes are checked for consistency with historic information before taking action by moving into the content generation stage. The basis for this decision is consistency analysis and the research underlying the VALS assessment.

In the content generation stage 214, memes are translated into expressions of memes by using synonyms for each of the terms in each meme, placing alternative expressions into pre-defined sentence structures associated with marketing, evaluating expressions against cognimetrics including emotional marketing value and the Big 5 factors and subfactors of LIWC, selecting and sorting expressions based on higher emotional values associated with identified customer characteristics, and producing a sorted list of expressions. The user selects and augments the memes and expressions until suitable expressions are identified for presentation.

Based on the delivery methods consistent with the other components of the marketplace, such as the place customers look and the way they receive information, expressions are formatted for delivery via those mechanisms and delivered to existing and potential customers. After delivery, the process is repeated based on new results from presentation and adapted based on metrics of responses as measured against the projected sales sieve, with adjustments made for cases where behaviors do not meet or exceed projections.

Example 2: Cybersecurity Countermeasures

In this example embodiment, the information gathering 208 from sensors and 3rd party providers is collected and packaged into content in the form of details organized by source of traffic, detected content patterns, shared vulnerability information, indicators of compromise from information sharing sources, internal sensors within technical networks and systems, intrusion and anomaly detection systems and so forth. Information on threats such as individuals, groups, nation states, organized crime, foreign intelligence sources, cyber extortionists, perpetrators of frauds, and so forth are also collected based on identified behaviors of such groups over history and recently. That information is packaged into various databases and made available for psychometric analysis.

The behaviors, indicators, and other available information on the association of content with sources of attacks and the mechanisms observed are analyzed to identify potential psychological factors 212 associated with different threat types and specific threat actors and associated with the sources of detected potential attack activities to associated cognimetrics with Targets 206 of the system.

The data from the cognimetric evaluation 212 may be fed into a decision-making process 216 that seeks to identify matches between the motivations, resources, capabilities, intents, initial access, and other similar information on groups and individuals of different types along with indicators of their activities and related matter analyzed in context of history for each identified Target to generate strategies and tactics directed toward driving the Targets away from less desired activities (e.g., successful break-ins to or expansion of access within, or exfiltration of content from, or disruption, and so forth of internal content, systems, operations, and so forth) and toward more desired ones (less harmful to us and more resource consumptive to them, such as disrupting group behaviors and cohesion, consuming time, increasing uncertainty about real information and certainty about deceptive information, and so forth). The desired outcome is an objective number or value such as a quantity of undesired activity from Threat actors. The As-Is information includes the current differentiating factors for the Target, methods they use, identifying information, metrics on occurrences of interactions with them, and so forth. The history includes the history of activities over time based on incoming threat activities and outgoing subsequent and proceeding actions taken by decision making. The decision is the selection of future memes which is done by associating benefits in terms of measured threat levels with actions taken and resulting cognimetrics for this and similar Targets. Each of the identified future memes are checked for consistency with historic effects before taking action by moving into the content generation stage. The basis for this decision is consistency analysis with pre-existing research and learned results from previous actions.

In the content generation stage 214, memes (e.g., disrupt identification of likely successful IP addresses for use by the Target) are translated into expressions of memes (e.g., descriptions of what to be sent to Target in terms of instruction sequences for use by traffic generation systems or deception wall configurations for redirection of select traffic from identified Target IP addresses) by using known sets of 'black hole' and 'deception' target IP addresses for the Target to be rerouted to depending on the information sent by the Target to those service mechanisms.

Based on the delivery methods 210 consistent with the other components of the system (e.g., the capabilities and network locations of deception walls, controls over various DNS servers, and so forth), format appropriate commands and configurations for the devices to be used, including devices intended to sense the specific activities expected to result from these changes (e.g., tune sensors to detect Target activities associated with these changes) and deliver those configurations and related information to those mechanisms. After delivery to these 3rd party delivery components, they will then respond to acts by the Targets as directed, and sensors will gather additional data related to these actions, associate those detected activities with those changes and the Targets and produce additional collected content for information gathering over time. After delivery, the process is repeated based on new results from sensors and other collected content and adapted based on metrics of responses as measured against the projected Target behavioral changes, with adjustments made for cases where behaviors do not meet or exceed projections.

Example 3: Human Influence Operations to Counter Mass Social Media Frauds and Sources of Propaganda In this example embodiment, Information gathering 208 from social media platforms is collected as combinations of posting content, time of posting, identity of posting party, social media source, and so forth. That information is packaged into various databases or other storage or transmission forms and made available for psychometric analysis.

The words, word sequences, and other similar features used and other available information is extracted in various ways for various analytical processes 212, those processes including such things as sentiment analysis, LIWC analysis, similarity analysis, detection of derogatory terms or speech elements, and other cognimetric analyses, including analysis of timing and similar information for things like time of day bucketing and association with sources and their behaviors within and between platforms. Analysis results are sent to decision making and associated with potential Targets of the system.

The analysis data may be fed into a decision-making process 216 that seeks to identify matches between the psychometric results and characteristics of influence operators. For example, similarity analysis may create groupings of identities associated with posts, time sequences may be used to identify causal chains of posts and track content to it's origin within and between social media sources, and so forth, with those decisions leading to actions associated with disrupting or enhancing content related to those actions by Targets of those actions. As-Is information being the specific information from each posting would be an example of how current state information is added to history information associated with one or more Targets, with psychological analysis of behaviors based on derived (LIWC related to Big 5) personality traits of multiple Targets used to generate actions intended to achieve desired reduction or enhancement of the ability of a Target to propagate messages in the media to additional postings and spread of the resulting Target-pushed memes. The basis for the decision process which selects between different actions is a combination of results from previous efforts in this arena with these Targets and pre-existing study results such as those associated with the Influence patent. Desired outcomes (e.g., reduce the influence in terms of replication of content from postings) associated with Targets may include things like reducing the extent to which their content is viewed by, using tactics like disrupting positive sentiment traffic in response to their postings, which may be translated into actions like posting negative affect responses to all of their postings very soon after they make those postings, or registering complaints about certain sorts of content as identified by cognimetric analysis; which have been tested in limited examples to be effective in this regard, thus producing the basis for such decisions.

In the content generation stage 214, memes (e.g., post negative affect responses soon after their postings/or register a complaint about their use of derogatory terms toward an identified group) are translated into expressions of memes (e.g., generative AI statements with defined affect directed specifically at the content of their postings along with details on which Targets in which venues to produce such affect with what certainty over what time frames/or a complaint registration means defined for the platform along with the basis for the complaint in the detected derogatory terms and their meaning to the adjudication process) and expressions of instructions to collection mechanisms to detect the resulting behaviors of Targets (e.g., what to look for the presence or absence of, or what to measure).

Based on the delivery methods 210 consistent with the other components of the system (e.g., the specific methods of postings and complaints in specific social media platforms/and the collection platforms and mechanisms used in the embodiment of the system), format expressions appropriately to the platform(s) and deliver them to the platforms while configuring collection mechanisms to detect resulting behaviors. After delivery to these 3rd party delivery components, they will then respond to acts by the Targets as directed, and sensors will gather additional data related to these actions, associate those detected activities with those changes and the Targets and produce additional collected content for information gathering over time. After delivery, the process is repeated based on new results from sensors and other collected content and adapted based on metrics of responses as measured against the projected Target behavioral changes, with adjustments made for cases where behaviors do not meet or exceed projections.

Example 4: Influence Operations to Counter Corruption of Operational Technology (OT) Systems In this example embodiment, the Information gathering 208 from operational technology systems is collected as signal value sequences generated over time by a target OT system. That information is packaged for use by combining the value sequences with the times of arrival, times of generation, signal values, and/or apparent sources of signals, and made available for psychometric analysis. The packaged signals are turned into parameters of cognimetrics 212 such as frequencies associated with wave forms from apparent sources, and analyzed for implied states of the Target physical environment, flows of material through the process controlled by the Target system, and so forth. Such analysis may be done, for example, by physics equations such as F=ma for identifying forces applied given a measured mass and measured acceleration, or natural frequencies associated with distances for materials in states, and so forth.

The analysis results are fed into a decision-making process 216 that seeks to identify matches between the cognimetric results and characteristics of the Target environment. For example, previous measured volumes of material in a container combined with known flows of material in and out of the container may be used to anticipate current (As-Is) and future volumes of material in the container to identify a cognitive dissonance when those differ by more than the historically determined differences, and so forth. Decisions regarding actions to be taken may include, for example, a decision to engage 3rd parties in investigating the cause of an excessive difference, compensating for the difference by engaging the Target to cause additional flows of material to compensate for an anticipated future out-of-desired situation in the Target, and so forth. Another sort of decision might be to act so as to rapidly change the Target situation within the bounds of safe operating conditions so as to intentionally induce responses. In this case, the action might be different in kind or in amount, and the history of actions taken might be updated to reflect this action so that future incoming cognimetric values may be properly compared to desired values, for example to detect differences between the basis and the invention's perception of the Target situation. The basis for the decision process which selects between different actions in this case may be a model of the Target and its environment and a set of pre-defined parameter values and safety limits characterized by the designers and/or operators of the Target system.

In the content generation stage 214, memes (e.g., 50 more units of material in container 5) are translated into expressions of memes (e.g., add 50 more units of material to the next delivery to container 5). Of course there may be more than one expression required to be generated for any given meme, depending on the specifics of the Target and its environment.

Based on the delivery methods consistent with the other components of the system (e.g., the specific way deliveries are ordered), format expressions appropriately to the Target and its environment are generated and delivered to the Target and/or 3rd party delivery mechanisms by transmission as appropriate. Collection mechanisms may also be informed via delivery of additional content for collection regarding the influence on the Target. After delivery, acts by the Targets may generate additional signals, and sensors may gather additional data related to these actions, associate those detected activities with those changes and the Targets and produce additional collected content for information gathering over time. As this process is repeated based on new results from sensors and other collected content and adapted based on metrics of responses as measured against the projected Target behavioral changes, adjustments may be made for cases where behaviors do not meet or exceed decision-making projections.

Example 5: Inconsistency Detection and Response

In this example embodiment, the Information gathering 208 from multiple sources is collected as combinations of time and location of sensed activities of the Target and 3rd party data regarding pre-defined activities of the world, such as flight departure and arrival times, computer records of activities by identified users. That information is packaged into a dataset made available for cognimetric analysis.

The time and location features associated with Targets and other available information is extracted for analysis (212), and the analysis is performed to detect inconsistencies in records of time and location. For example, travel information may be used to determine whether there is a path by which a Target could have been in one place at one time and another place at another time. Results of this analysis are typically in the form of sequences of records associated with times and locations and a point in those sequences when inconsistency is detected. Analysis results are sent to decision making and associated with potential Targets of the system.

These results are fed into a decision-making process (216) that seeks to identify potential causes of inconsistencies in the form of Target activities. Examples of causes include aspects of turning behavior by Targets such as change in loyalty, misuse of systems that generate records, errors in data generation and collection processes, acts of 3rd parties, and so forth. The basis for analysis, for example, may be predetermined mechanisms by which causes may produce effects in terms of records, where said records are inconsistent within or between records and/or sources. Historical information such as Target activity records and previous inconsistency detection results and current inconsistency detection are combined through a decision process to associate causes with historical and current (As-Is) results and to identify causes historically associated with other Targets or pre-determined criteria. The result in this case might, for example, be a set of possible causes that can be differentiated by different acts of influence on a Target. The desired future is a determination of the cause of the inconsistencies, and the decision process determines the next action to be taken to try to differentiate between these causes and potentially to influence the Target so that future causes will be a desired subset, such as errors in 3rd party sources of information, as opposed to future turning behavior of the Target. Actions might include, for example, increase detection of Target location with time, the purpose of which is to increase the number of records available and the granularity of time so that the point of inconsistency may be more closely determined and, if the Target is subverting the normal process of record production, this will be more readily differentiated.

In the content generation stage (214), memes (e.g., decrease time between detected Target actions) are translated (e.g., generate sequences of stops for the Target's delivery schedule that reduces the gaps in time when the Target is not detected, or provide a device to the Target that tracks the Target with greater frequency, or other similar approaches) into expressions of memes (e.g., the new schedule for Target deliveries, an order to provide the Target with a tracking device, and so forth).

Based on the delivery methods consistent with the other components of the system (e.g., the specific methods of delivering a specific tracking device to a Target, or the specific mechanism required to change an automated schedule system to reflect a new schedule), format expressions appropriately to the mechanisms and deliver them to the 3rd parties involved in schedule generation, placement of tracking devices, and so forth. Presentation may also provide additional data feeds for collection within Information Gathering and Cognimetric Evaluation to allow increased 'focus of attention' on the measurable data associated with the desired detection.

After delivery, the Target 206 will respond by generating acts that are detected in the information gathering process (208), sensors will gather additional data related to these actions, associate those detected activities with those changes and the Targets and produce additional collected content for information gathering over time. The process may then be repeated based on new results from sensors and other collected content and adapted based on metrics of responses as measured against the projected Target behavioral changes, with adjustments made for cases where behaviors do not meet or exceed projections.

Figure 3:
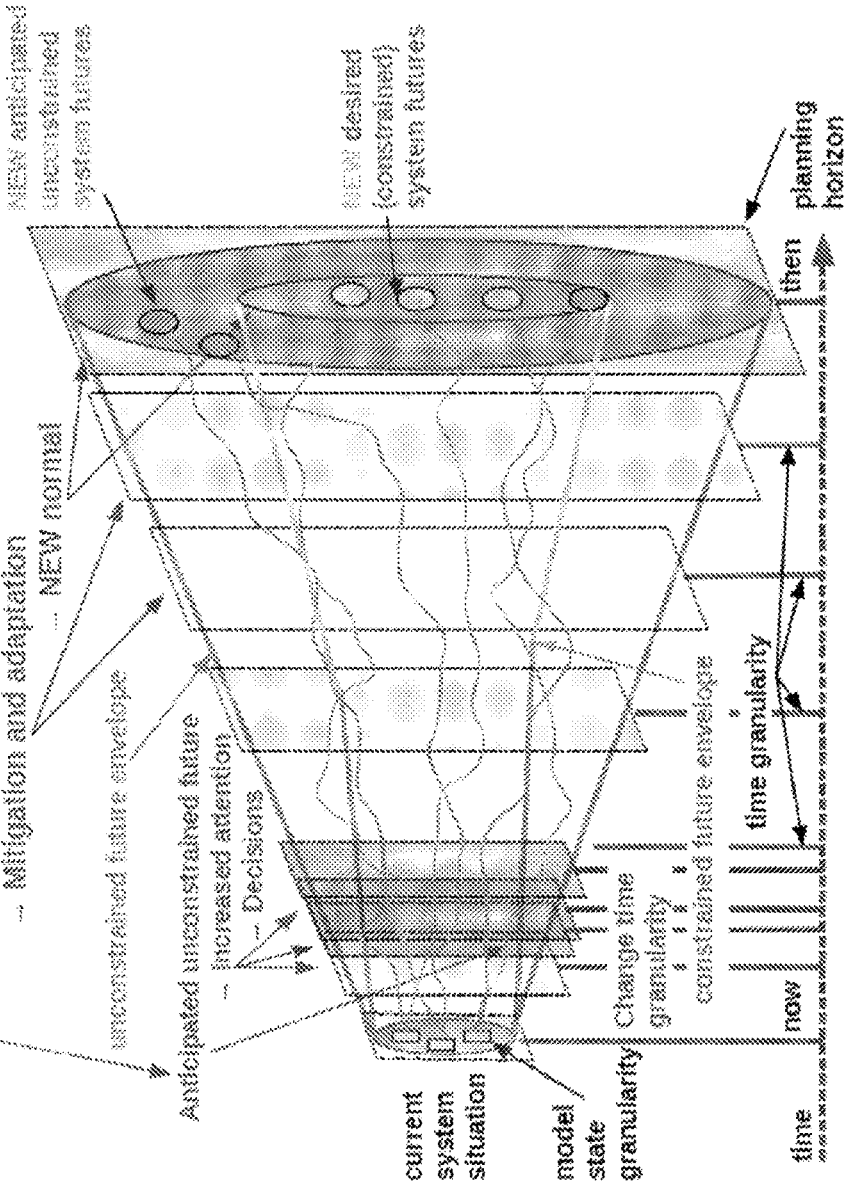
FIG. 3 illustrating model-based situation anticipation and constraint.

Example 6: Model-Based Situation Anticipation and Constraint (MBSAC) is Used to Influence Actions of Targets to Constrain Anticipated Future Situations The concept of MBSAC has existed for more than 20 years, and is characterized the diagram in FIG. 3 and the below description. A current system situation is characterized by a model of a state space with finite granularity. As time moves forward, it is anticipated through modeling and simulation that future state spaces may come to be. These arise as a result of actions taken by active parties and nature.

The model has limited, but possibly variable and controllable time granularity, in the sense that more effort may be made for smaller time segments at the cost of increased resource consumption. A desired (constrained) anticipated future state is differentiated from an undesired (unconstrained) anticipated future state as a function of the state space, so that, for example, some set of state variable regarding costs, locations of things, or whatever is being modeled might be in desired ranges or have desired values. Over time, decisions are made by parties to take actions, in a similar way to how game theory is typically characterized. We typically call these actions by parties "moves" in the language of game theory. The object of the system is to anticipate and constrain the future by modes that can be made by each party. In the language of the current patent, this would be to influence the Target, and MBSAC would be a method of the decision making component. Prior to this disclosure, the concept of MBSAC has been discussed and published in many fora. However, the challenge of implementing the concept has remained problematic because it stands alone as a decision making model and in order to realize it, it has to be put in an operational context. The system and method provides such a context by providing the means to interact between the Target and the decision-making model through information gathering, cognimetric evaluation, content generation, and presentation.

In this example embodiment, the Information gathering 208 from relevant sources to measurement of future states is collected in whatever forms it exists from Targets of constraint and 3rd parties. For example, it might constitute collection of details of leads (Targets) in a sales sieve or simulation of a sales and marketing process, and responses of those leads to actions to promote a company to those leads. That information is packaged into a form suitable for cognimetric analysis for a sales sieve.

The actions of Targets identified by the information gathered are turned into content for analysis (212) by associating actions taken, such as clicking on links in emails, opening and displaying emails, calling identified phone numbers, entering product codes, and so forth with the Target taking those actions and determining whether they have moved from state to state in the sales sieve or similar simulation of the sales process. Analysis results are sent to decision making and associated with potential Targets of the system.

The results of cognimetric evaluation (212) are fed into a decision-making process (216) that is implemented to model the current state space of Targets in terms of a set of states in a state space with finite granularity and dimensions. This model uses a basis, potentially incorporating historical states, to project future states of the state space under varying assumptions of actions taken by Targets and the actions of the present invention. These models can be in the form of simulations, wherein a simulation has finite granularity of time and the space state, and in which outcomes of the simulation at different times in the future are compared to desired states in the state space so as to differentiate between desired and undesired states over time. The model then tests different sets of actions (called moves) by Targets and the present invention by simulating the sequences forward in time to project future state spaces, selecting moves that tend to keep the future states spaces within the desired or more desired regions of the future state spaces as its decisions regarding moves (actions) to take. It takes these actions through content generation. A more specific example of this is the use of projections of sales over time based on simulations or other computational means such as those provided herein. In this context, acts involve communications.

In the content generation stage (214), in the sales and marketing context, actions like "send call to action followup" produce memes by applying cognimetrics associated with the Targets to identify memes from a set of pre-defined memes associated with offering differentiators, and from there produce expressions of those memes by taking standard sentence structures and combining them, for example, through generative AI like ChatGPT, or by measurement against cognimetrics associated with emotional components, to generate expressions to be sent to Targets.

Based on the delivery methods consistent with the specific Target, for example social media mechanisms, email, text message, and so forth, expressions are formatted for delivery, such as within the context of an email attachment or text within an email, and formatted expressions are delivered through protocols used for delivery, such as the Simple Mail Transfer Protocol for emails, to appropriate 3rd parties such as ISPs or social media providers for delivery to Targets. After delivery to these 3rd party delivery components, acts by Targets over time are anticipated, and information gathering mechanisms may be configured so as to focus on such responses by things like setting expected delivery dates for responses to trigger lack of response content, and so forth. After delivery, the process is repeated based on new results from sensors and other collected content and adapted based on metrics of responses as measured against the projected Target behaviors, with adjustments made for cases where behaviors do not meet or exceed projections. Projections are then updated over time commensurate with the new state information.

Example 7: Selling Services to CEOs

In this embodiment, a more specific combination of methods are disclosed showing interfaces that demonstrate the capability. In this case, user interaction may be used to adapt information throughout the system so that it acts as a tool to help the user do the job more efficiently and effectively. The example shown are intended for illustrative purposes only as a person of ordinary skill would understand that, given this disclosure, that different components and implementation in different computer languages and operating environment, interfaces, etc. and using different external mechanisms would allow for many different specific embodiments.

In this example embodiment, the Information is gathering (208) in voice form from recordings of CEOs presenting their companies to investors. An example of the user interface is shown in FIG. 4. For example, Angel to Exit does this as part of it's Go To Angel service. From there, voice to text is used, for example from Google services or other vendors, to turn the information gathered into text content for analysis. The content is packaged as the CEO contact and other information gathered from independent 3rd parties along with the text output. An analysis (212) of the text is processed using LIWC and combined with other text found from other sources in (1) relating to the CEO and their situation to produce personality traits per the Big 5 and similar metrics such as the sub-parts of the Big 5 and other less well studied sentiment indicators. The results include the information gathered and analytical assessment of personality traits, and these are made available to decision making.

Figures 1, 5B:
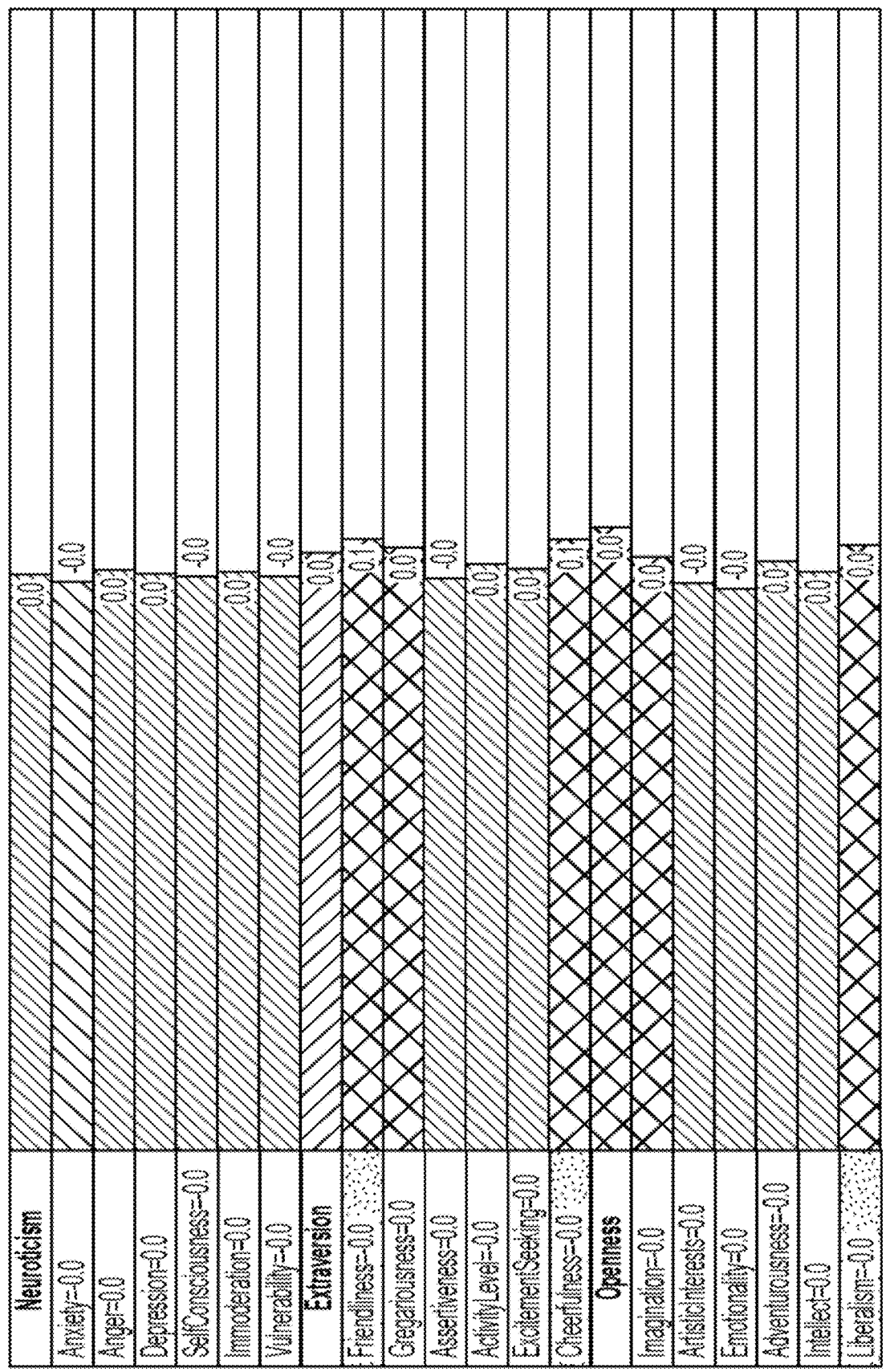
Figures 2, 5B:
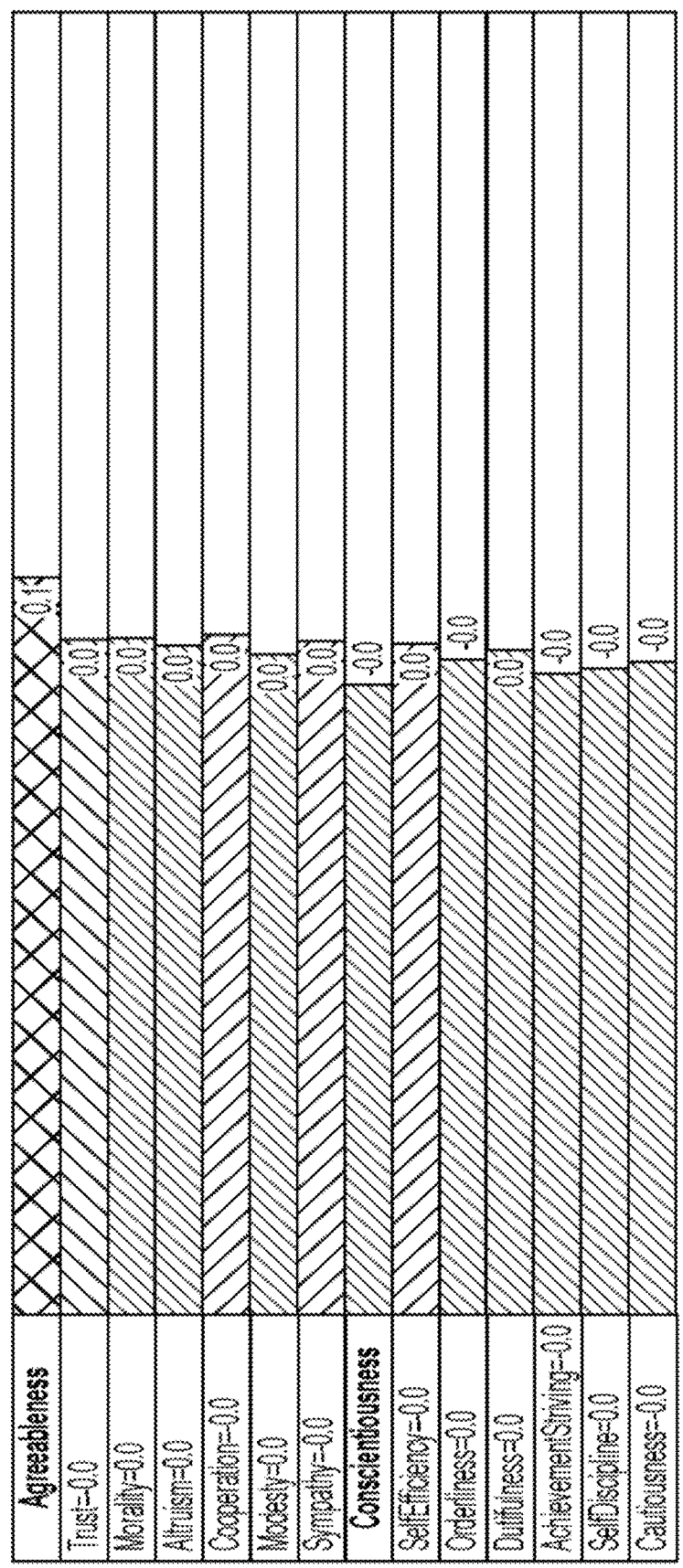

This produces the detailed metrics as shown in FIGS. 5A and 5B that are displayed to the user. The user interface of the metrics has a background and interpretation sections that explain the metrics. For example, the interpretation section notes that the results range from −1 to 1 with "−1" representing maximum negative correlation (i.e., the component part is contradicted to the maximum extent possible) and "1" representing maximum positive correlation (i.e., the component part is indicated to the maximum extent possible.) The interpretation portion also has a chart showing a summary of the results of the examples of the analysis. Below the chart are the detailed results for the text.

The results of cognimetric evaluation 212 may be analyzed using the methods of influence analysis disclosed in U.S. Pat. No. 8,095,492 B2 that is incorporated herein by reference to produce communications strategies based on the state of the sales process and analysis demonstrated in the software disclosure of that patent. They generate communication tactics which are passed along with the related information from Step 2 to Step 3. An example output is shown in FIGS. 6 and 7.

Figure 8C:
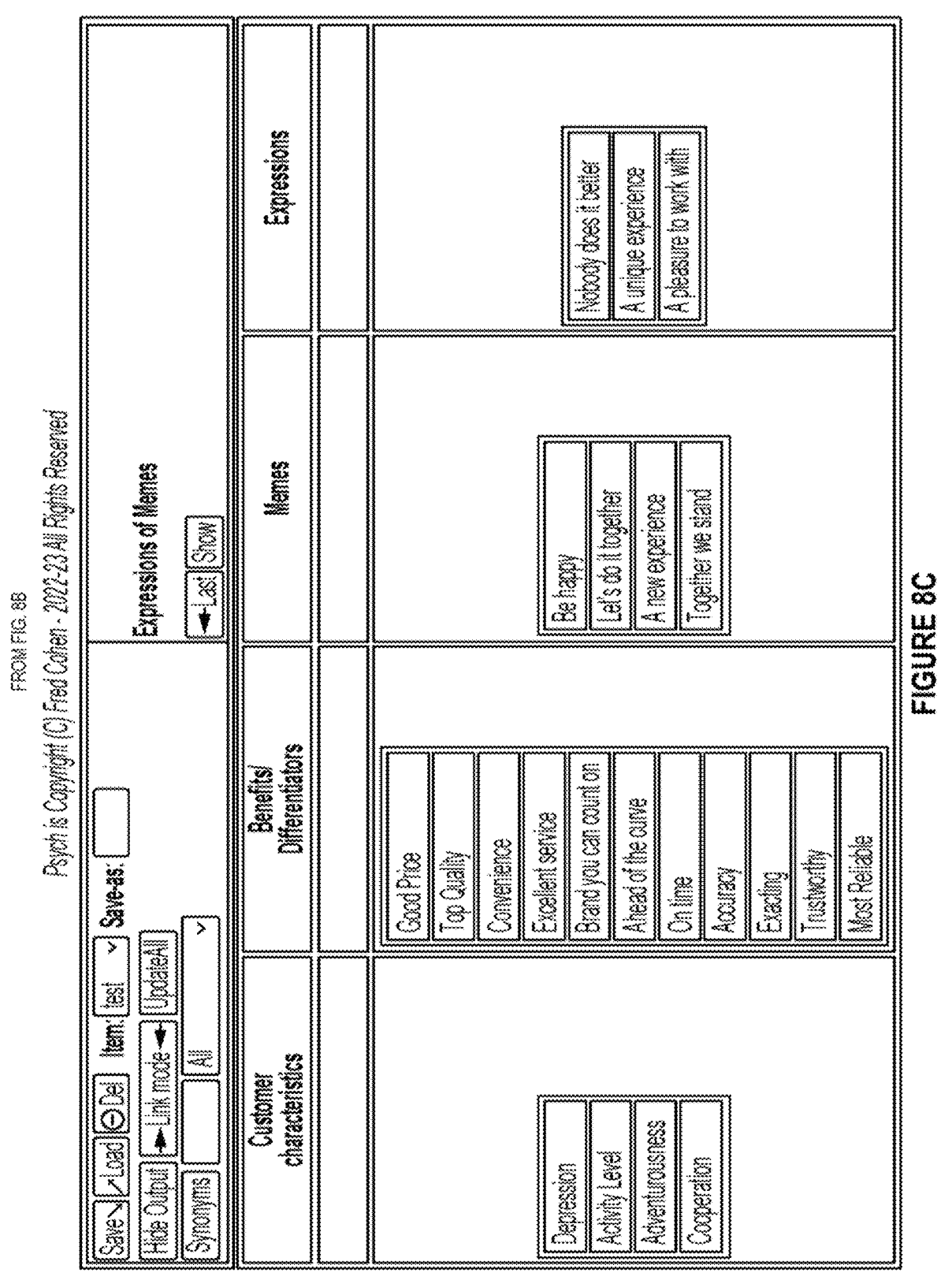

In the content generation stage 214, expressions are generated from benefits and differentiators linked to customer characteristics from preset linkages as altered or augmented by the user. An example user interface of this is shown in FIG. 8. This process involves using synonyms to suggest changes to memes and increase the extent to which they match the personality characteristics of the CEO. Once memes and expressions are set as shown in FIG. 8.

Based on the delivery methods 210 consistent with the specific Target, for example social media interactions, text messaging, or email, standard forms and formats are applied to the specific expressions, and delivery is made, subject to sales person review, through the appropriate provider 3rd party to the CEO. After delivery, Targets respond (or don't) over time, and this is used as subsequent content collected, compared to the anticipated movement in the influence space per the simulation methods of the Influence software, and tactics changed over time based on updates from gathered information and cognimetrics, taking into account the history, basis, and updated as-is situation in Decision Making, toward the goal of increasing favorability and import for the CEO toward closing the deal, producing updated content generation and presentation, and so forth. For a generic marketing and sales approach, these characteristics represent typical CEOs in the field and aggregate responses to influence, whereas for a specific on-to-one approach, they are specific to the CEO.

Mix and Match Examples

As will, after this disclosure and without undue experimentation, be readily apparent to a person of ordinary skill in the art, many variations on these examples may be implemented by connecting existing technologies from different fields and creating interfaces and communications mechanisms between components, in many cases with such components performing more than one of the identified elements, and in some cases with more direct connections between elements.

As examples, and without limit, a single or multitude of similar or different database or other storage and retrieval technologies may be used for information gathering, cognimetric evaluation, decision making, content generation, and presentation, with storage and retrieval configured such that all manner of components associated with Targets are updated, added, remove, and otherwise operated on over time. For example, storage may be in the form of levels of fluid or makeup of a solution, voltage levels, charges stored in capacitors, frequencies of emitted signals, mechanical location and/or position, colors and levels of light or sound, states of subatomic particles, or any other method appropriate to the mechanisms of implementation.

As another example, a single or multitude of similar or different processing technologies may be used for operations of information gathering, cognimetric evaluation, decision making, content generation, and presentation, with processing configured such that different processes are undertaken by different or the same processing components or specific components selected for particular purposes. In today's world, such processing elements may be composed of digital, analog, mechanical, optical, biological, chemical, genetic, quantum, or other mechanisms, or combinations of these. For example, sound input is commonly operated by a processing device converting sound to analog signals that are then converted to digital values by another processor, a digital interface to an analog computer may control a mechanical mechanism that pumps fluid through an interface to a human body that processes chemicals enhance failing bodily functions, with measurements of genetics of excreted cells measured through a nano-mechanical and chemical processor to detect diseases, resulting in analog electrical values translated through a conversion processor into digital signals, and so forth.

In another example, a single or multitude of similar or different communications technologies may be used for communicating within and between of information gathering, cognimetric evaluation, decision making, content generation, and presentation, with communications configured such that it uses the same or different communications components, protocols, signaling, and so forth. Such communications technologies will necessarily be tied to the processing and storage technologies and conversions between such technologies.

In another example, a single or multitude of different analytical methods may be used for operations of information gathering, cognimetric evaluation, decision making, content generation, and presentation, with analytical methods configured such that the same or different such methods may be used in multiple ways for different aspects of the invention and more than one such analytical method may be used in any given aspect of the system and method. For example, a combination of Markov models, statistical mechanisms, combinational and sequential logic, LIWC analysis, biological, digital, or analog neural networks, optical lenses, shaped tubes, and so forth may be used.

The component subparts of each of information gathering, cognimetric evaluation, decision making, content generation, and presentation may be combined within and between components of the composite so that, for example; collection and packaging may be undertaken within the same software routines and simultaneously or in steps that alternate between collection and packaging; the same applies to content and analysis within cognimetric evaluation; the same applies to the components of Decision making, Content generation, and Presentation; and further that the same applies to components of each of information gathering, cognimetric evaluation, decision making, content generation, and presentation operating in combination, such as actions and memes, expression and format, analysis and basis, and so forth; including combinations of more than two of such components and their sub-components. Similarly, implementations may be cojoined, for example, a single field programmable gate array may be used to implement multiple components or sub-components of different components, or even the entire mechanism of the system and method. The composite as a whole, operable in conjunction with one or more Targets over time and for non-random situational spaces will tend to induce and/or suppress signals that produce behaviors in Targets that produce additional signals that reach information gathering resulting in changes in cognimetrics. Those changes may then result in updated history and situation information within the decision making component that are consistent or inconsistent, nearer or farther from objectives, or otherwise lead to subsequent decisions producing different content generation and presentation in what may be understood as a cognitive feedback system. Such a system may act to drive a Target toward a desired situation and/or update the content and/or mechanisms within components of the overall composite to produce changes in the composite over time that may tend to perform differently with respect to influences on Targets.

Generation may be done by starting with random selections in; various components, elements of those components, and/or embodiments of those elements, and/or decision thresholds, and/or so forth; of the composite, applying the feedback to these mechanisms of the composite to produce improved performance against desired situations over time. This could be done, for example, by comparing desired to actual cognimetrics and correlating changes in decisions to changes in the difference and changing decision metrics to increase or decrease based on the correlation of set values to differences.

Portions of information gathering and cognimetric evaluation may be performed together so that, for example, the packaging sub-component may be combined with the content sub-component, the expression and format sub-components may be combined, and so forth. Similarly, components and sub-components and portions thereof may be performed in whole or in part by independent mechanisms at potentially distant locations, with additional communications and coordination mechanisms to coordinate and combine these parts to form a whole composite.

Portions of the composite may be left out and still provide a functional capability, so that, for example, information gathering might be connected directly or indirectly to decision-making, which may be connected directly or indirectly to presentation, and so forth.

Within this disclosure, and within the claims herein, the term "a" should be understood to mean "one or more", the term "the" when referring to an item identified with "a" should be understood to mean "the one or more", and generally, unless otherwise indicated, singular terms should be understood to include plural terms. Similarly, the term "actor" when referring to the Target of the present invention should be understood to include the term "actor", "data" should be understood to include information in any form, the term "database" should be understood to include all means of storage and retrieval of data and not just those structures as tables or similar structures, and terms related to psychometrics and psychology should be understood to be included in and inclusive of the broader terms cognimetrics and cognology.

In one embodiment, the disclosed system and method may implement influencer actions in the system. A computer implemented method operable for automatically recommending influence actions may include: One or more computers performing the steps of: receiving situation data regarding one or more situations and one or more desired outcomes; receiving data regarding one or more actors that have one or more relationships to said situations wherein said actor data comprises, for one or more of said actors, one or more values indicating one or more relationships of said actors to said desired outcomes; wherein said values define a multi-dimensional space; placing data indicators representing said one or more actors in said multi-dimensional space according to said values for said actors; storing data regarding said situations and said actors; using said situation data values to select influence actions applicable to actors from a predetermined recommendations database by applying rules to said values; said predetermined recommendations database comprising a predetermined set of influence actions applicable said actors, said influence actions each directed to adjusting said relationships of said actors to said situations toward said desired outcomes; and presenting one or more recommended influence actions applicable to said actors. The process of receiving may receive data from a cognimetric evaluation process. The process of receiving situation data may be received after passing through an information gathering process, such as Cognimetrics. The method may present one or more recommended influence actions applicable to said actors is presented through a content generation process or a presentation process, such as Human Deception or so as to present consistent outputs, such as a Consistency analysis or presented through mechanisms that induce and/or suppress signals intended to produce deceptive information intended to produce desired behaviors in said actors wherein said desired behaviors differ from behaviors produced when such signals are not induced or suppressed. [human and non-human actors]. In the method, the influence actions and relationships to situations are associated with cybersecurity decision-making as determined by elements of a standards of practice approach, such as using Scaleable Cyber security disclosed in the Scaleable Cyber security patent incorporated herein by reference. In the method, the presentations are directed toward one or more cognitive levels of said actors [Cognitive levels from Influence and others]. In the method, the receipt of the situation data and the actor related to said situations or desired outcomes is received after previous said presentation of said influence actions to said actors and produces subsequent such influence actions when acting though the method of claim 1. [feedback system] In the method, actor information involves one or more of social media information, messaging information, verbal information, video information, sensor information from sensors of any type, information from or gathered and/or delivered through 3rd parties, or information produced by actors based on their estimates, approximations, or random information.

In some embodiments, the system and method provides multiple assessments in which multiple concurrent assessments are performed for multiple parties using one or more computer systems that accesses one or more data sets, wherein each data set indicates a standard of practice for each assessment, each standard of practice further comprises one or more decisions, a finite number of alternative actions for each decision, a procedure for choosing between the finite number of alternative actions, and a basis for making the one or more decisions; that uses one or more logic processors of the one or more computer systems to apply the standard of practice concurrently to each of the multiple parties in order to: gather information regarding each of the multiple parties; apply the standard of practice for each party to the gathered information regarding each of the multiple parties; access and present "as-is" information associated with the information gathered for each of the multiple parties for review; determine reasonable and prudent future state information for the protection program for each party based on the standard of practice for each of the multiple parties; and present results for each party of the multiple parties. In the multiple assessments, the gathering of information may be performed after passing through a cognimetric evaluation process [Cognimetrics] or may be performed after passing through an information gathering process [Cognimetrics]. The multiple assessments method presents results to the parties through a content generation process or wherein the results to the parties are presented through a presentation process [Human Deception], or are presented so as to present consistent outputs [Consistency analysis] or are presented through mechanisms that induce and/or suppress signals intended to produce deceptive information intended to produce desired behaviors in said parties wherein said desired behaviors differ from behaviors produced when such signals are not induced or suppressed. [human and non-human actors]. The presentation results of the parties may be directed toward one or more cognitive levels of said actors [Cognitive levels from Influence and others]. For the multiple assessments, the information is gathered after previous presentation of results to the parties produces subsequent such gathered information when acting though the method [feedback system] or it may involve one or more of social media information, messaging information, verbal information, video information, sensor information from sensors of any type, information from or gathered and/or delivered through 3rd parties, or information produced by parties based on their estimates, approximations, or random information.

In some embodiments, a computer implemented method operable for influencing a Target may perform information gathering regarding a Target of influence, cognimetric evaluation of such gathered information, decision-making of results of such cognimetric evaluation in the context of one or more of historical information, a basis for decision-making, a decision-making mechanism, a desired future situation, and a set of available actions, producing influence actions to be taken, content generation based on said influence actions to be taken and presentation of generated content to a Target of influence, optionally through a third party. The decision-making may apply standards of practice to produce a desired future state and actions to be taken, the decisions-making is directed toward creating deceptions, the decisions-making are decisions about influencing one or more actors, and/or the decision-making uses psychological or cognological analysis methods to influence decisions in a Target. The decision making may apply cognological factors [per Influence and deception background] or may apply a basis based on cognological research results [per Influence and Deception]. The decision making may use as-is information is related to a current cognological state or characteristics or cognimetric values. The determination of the future state information may be performed by a method of automatically recommending influence actions. In the method, the Target may be a human actor, an animal actor, an automated actor, a group composed of more than one of humans, animals, and automated systems, or a composite composed of more than one of any of these. In one embodiment, each automated system may be a cognology system/device that receives inputs from other connected cognology system/device and outputs results to the other connected cognology systems/devices. The information gathering process in the method is comprised of one or more of steps of collection and packaging steps, said cognimetric evaluation is composed of one or more of steps of content extraction and cognimetric analysis, said content generation is composed of one or more of steps of Meme generation and Expression generation, and said presentation is comprised of one or more of steps of formatting and delivery. In the method, the results of Target actions after said step of Presentation produce signals that are gathered through said step of Information Gathering resulting to produce subsequent Presentation to Target and Gathering so as to operate repeatedly over time. The decision making may implement model-based situation anticipation and constraint and/or may be directed toward detecting or countering turning behavior and/or may be directed toward perturbing systems to detect and counter corruption of operational technology and/or may be directed to detecting and responding to inconsistencies regarding time and location. The decision making may apply a method for providing and/or analyzing and/or presenting decisions means and/or may apply a method for providing and/or analyzing influence strategies means. The method may be used to influence a Target embodies in part a method for network deception/emulation and/or may be used to influence a Target embodies in part a method providing deception and/or altered operation of an information system operating system and/or may be used to influence a Target embodied as part a method providing configurable communications network defenses and/or to influence a Target that embodies in part a method for specifying communication indication matching and/or responses, and/or to influence a Target that embodies in part a method for invisible network responder and/or to influence a Target that embodies in part a method for providing deception and/or altered execution of logic in an information system.

In some embodiments, a computer system is provided that is operable for influencing a Target that has storage for storing pre-existing program code and related data for subsequent retrieval, storage for storing and retrieving data that may be altered over time by one or more processors, an interface for receiving signals from or regarding a Target related to a situation, the one or more processors operable for collecting the received signals, for packaging said collected information, for extracting content from said packaged information; for cognimetric evaluation of said extracted content; for applying a decision-making mechanism to results of said cognimetric evaluation; for generating meme information from said results of decision-making; for generating expressions of memes from said meme information; for formatting said expressions for delivery; and for preparing the formatted expressions for delivery and an interface mechanism for transmitting said delivery information as signals to or regarding said Target. The cognimetric evaluation generates statistical data relating said extracted content to cognitive characteristics of a Target and/or generates data relating said extracted content to cognitive characteristics of a Target using predetermined metrics. The meme generation generates said meme information using predefined mappings. The expression generation generates said expressions using cognimetric evaluation of multiple expressions to identify properties of said expressions and match them to desired criteria or optimize them against metrics resulting from said decision-making. The meme generation generates said meme information using pseudo-random selection or generation from preexisting templates. The formatting of the expressions selects a format from a predetermined set of formats or format templates associated with available delivery mechanism identified for a Target. The delivery preparation selects a preparation method from a predetermined set of delivery mechanism associated with available delivery mechanisms identified for a Target. The decision-making element/mechanism applies a standards of practice mechanism and/or applies a model-based situation anticipation and constraint mechanism and/or applies a deception-oriented decision-making mechanism and/or applies a system for providing and/or analyzing and/or presenting decisions mechanisms and/or applies a system for providing and/or analyzing influence strategies. The computer system is operable for influencing a Target that embodies in part an apparatus for network deception/emulation and/or for influencing a Target embodies in part an apparatus providing deception and/or altered operation of an information system operating system and/or influencing a Target embodies in part an apparatus providing configurable communications network defenses and/or influencing a Target that embodies in part an apparatus for specifying communication indication matching and/or responses and/or influencing a Target embodies in part an apparatus for invisible network responder and/or operable for influencing a Target embodies in part an apparatus for providing deception and/or altered execution of logic in an information system.

The foregoing description, for purpose of explanation, has been with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include and/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general-purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD, MIMD, MISD and/or MIMD instructions), field programmable logic arrays or any mix thereof which provides the desired level performance and cost.

As disclosed herein, features consistent with the disclosure may be implemented via computer-hardware, software, and/or firmware and/or other mechanisms for computation including optical transforms, light or other electromagnetic tunnels, quantum computing devices, wetware, biological computers, analog computing mechanisms, or any other similar mechanism, including composites composed of multiple such mechanisms. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

What is claimed is:

1. A computer implemented method comprising:
   receiving, by a computer system, information gathered about a target of influence; related to a situation
   performing, by the computer system, a cognimetric evaluation of the gathered information to measure one or more observable indicators of behaviors of the target of influence to generate cognimetric evaluation results for the target of influence, the cognimetric evaluation programatically generating values for one or more previously identified traits of the target of influence; and
   performing an action to influence a future action of the target of influence, wherein the action to influence is one of a predetermined number of defined actions intended to move the target of influence away from undesired activities and toward desired activities.

2. The method of claim 1 further comprising performing, by the computer system, decision making to generate one or more recommended actions to influence based on the generated cognimetric evaluation results and performing the one or more recommended actions to influence on the target of influence.

3. The method of claim 2, wherein performing the decision making further comprises performing, by the computer system, decision-making on of the cognimetric evaluation results in a context of one or more of historical information, a basis for decision-making, a decision-making mechanism, a desired future situation, and a set of available actions, wherein the decision making produces one or more recommended influence actions.

4. The method of claim 2, wherein performing the one or more recommended actions further comprises presenting the one or more recommended actions to influence through a third party to the target of influence.

5. The method of claim 2, wherein performing decision making further comprises one of applying, by the computer system, one or more standards of practice to produce a desired future state and the one or more recommended actions to influence, creating deceptions, producing the one or more recommended actions to influence that influence one or more actors, and using psychological or cognological analysis methods to influence decisions of the target of influence.

6. The method of claim 5, wherein using the cognological analysis method further comprises one of applying, by the computer system, cognological factors, applying, by the computer system, a basis based on the one or more cognological research results, and using, by the computer system, as-is information related to a current cognological state or characteristics or cognimetric values for the one or more previously identified traits of the target of influence.

7. The method of claim 1, wherein the target of influence is one of a human actor, a living being actor, an automated actor, a group composed of more than one of humans, living beings, and automated systems, and a composite composed of more than one of a human actor, a living being actor, and an automated actor.

8. The method of claim 2, wherein receiving the gathered information further comprises one or more of collecting and packaging the information, wherein performing the cognimetric evaluation further comprises one or more of content extraction and cognimetric analysis, wherein the generating of content further comprises one or more of generating a meme and generating an expression, and further comprising presenting the cognometric analysis results that further comprises one or more of formatting the cognometric analysis results and delivering the cognometric analysis results.

9. The method of claim 1 further comprising producing, as a result of target of influence recommended actions to influence, signals that are gathered through information gathering and producing a subsequent presentation to the target of influence.

10. The method of claim 2, wherein performing the decision making further comprises one of using model-based situation anticipation and constraint, detecting or countering turning behavior, using a perturbing system to detect and counter corruption of operational technology, detecting and responding to inconsistencies regarding time and location, providing and/or analyzing and/or presenting decisions, and providing and/or analyzing influence strategies.

11. The method of claim 1, wherein the method further comprises one or more of:
   embodying network deception/emulation,
   embodying deception and/or altered operation of an information system operating system,
   embodying providing configurable communications network defenses,
   embodying specifying communication indication matching and/or responses,
   embodying an invisible network responder, and
   embodying deception and/or altered execution of logic in an information system.

12. The method of claim 1 further comprising performing, by the computer system, a selection of the cognimetric evaluation results from the cognimetric evaluation results for the target of influence, wherein the selection produces one or more recommended actions to influence from a predetermined set of previously defined actions to influence.

13. The method of claim 12 further comprising performing, by the computer system, decision-making on the cognimetric evaluation results in the context of one or more of historical information, a basis for decision-making, a decision-making mechanism, a desired future situation, and a set of available actions, wherein the decision-making produces one or more recommended actions to influence.

14. The method of claim 12, wherein performing decision-making further comprises using psychological or cognological analysis to produce the one or more recommended actions to influence the target of influence.

15. The method of claim 12, wherein performing the decision making further comprises one or more of:
   using model-based situation anticipation and constraint,
   detecting or countering turning behavior,
   using a perturbing system to detect and counter corruption of operational technology,
   detecting and responding to inconsistencies regarding time and location,
   providing and/or analyzing and/or presenting decisions, and
   providing and/or analyzing influence strategies.

16. A system, comprising:
   a processor;
   storage connected to the processor that stores program code and related data for subsequent retrieval and that stores and retrieves data that may be altered over time by the processor;

an interface connected to the processor for receiving signals about a target of influence related to a situation;

the processor executing the program code and is configured to:

receive signals about the target of influence related to a situation at the interface and generate, from the received signals, information gathered about the target of influence;

perform a cognimetric evaluation of the received signals to measure one or more observable indicators of behaviors of the target of influence to generate cognimetric evaluation results for the target of influence, the cognimetric evaluation programatically generating one or more values from a predetermined number of values for the target of influence; and perform, based on the one or more values, one or more recommended actions to influence of a set of predetermined recommended actions to influence to present information to the target of influence intended to produce one or more future actions by the target of influence.

17. The system of claim 16, wherein the processor is further configured to perform decision making of the cognimetric evaluation results, wherein the decision making produces the one or more recommended actions to influence.

18. The system of claim 17, wherein the processor is further configured to, through collection of signals from the interface, gather information regarding a target of influence and present the one or more recommended actions to influence to the target of influence.

19. The system of claim 17, wherein the processor is further configured to perform decision-making of the cognimetric evaluation results in the context of one or more of historical information, a basis for decision-making, a decision-making mechanism, a desired future situation, and a set of available actions, wherein the decision-making produces the one or more recommended actions to influence.

20. The system of claim 17, wherein the processor is further configured to present the one or more recommended actions to influence through a third party to the target of influence.

21. The system of claim 17, wherein the processor is further configured to one of;

apply one or more standards of practice to produce a desired future state and the recommended actions to influence, create deceptions, produce the one or more recommended actions to influence the target of influence, and use psychological or cognological analysis to influence decisions of the target of influence.

22. The system of claim 21, wherein the processor is further configured to one of apply cognological factors, apply a basis based on the cognological evaluation results, and use as-is information related to a current cognological state or characteristics or cognimetric values for the one or more previously identified traits of the target of influence.

23. The system of claim 17, wherein the target of influence is one of;

a human actor, a living being actor, an automated actor, a group composed of more than one of humans, living beings, and automated systems, and a composite composed of more than one of a human actor, a living being actor and an automated actor.

24. The system of claim 17, wherein the processor is further configured to; one or more of collect and package the information regarding the target of influence, extract content and perform cognimetric analysis, and generate a meme or an expression.

25. The system of claim 18, wherein the processor is further configured to receive, after the one or more recommended actions to influence, subsequent information gathered about the target of influence and generate a subsequent presentation to the target of influence.

26. The system of claim 16, wherein the processor is further configured to one or more of:

perform model-based situation anticipation and constraint, detect or counter a turning behavior, use a perturbing system to detect and counter corruption of operational technology, detect and respond to inconsistencies regarding time and location, provide, analyze and/or present decisions, and provide and/or analyze influence strategies.

27. The system of claim 16, wherein the processor is further configured to one or more of:

embody network deception/emulation, embody deception and/or altered operation of an information system operating system, embody providing configurable communications network defenses, embody specifying communication indication matching and/or responses, embody an invisible network responder, and embody providing deception and/or altered execution of logic in an information system.

28. The system of claim 16, wherein the processor is further configured to perform decision-making of the cognimetric evaluation results, wherein the decision-making produces one or more recommended actions to influence.

29. The system of claim 28, wherein the processor is further configured to perform decision-making on the cognimetric evaluation results in the context of one or more of historical information, a basis for decision-making, a decision-making mechanism, a desired future situation, and a set of available actions, wherein the decision-making produces the one or more recommended actions to influence.

30. The system of claim 28, wherein the processor is further configured to one of:

apply cognological factors, apply a basis based on cognological research results, and use as-is information related to a current cognological state or characteristics or cognimetric values for the one or more previously identified traits of the target of influence.

31. The system of claim 28, wherein the predetermined set of objectives are one of a behavior that increases the number of decisions or magnitude of the decisions by the target of influence favorable to an operator of the system and a behavior that reduces the number of decisions or magnitude of the decisions that disfavors the operator of the system.

* * * * *